United States Patent
Costa et al.

(10) Patent No.: US 11,621,242 B2
(45) Date of Patent: Apr. 4, 2023

(54) RF DEVICES WITH ENHANCED PERFORMANCE AND METHODS OF FORMING THE SAME

(71) Applicant: Qorvo US, Inc., Greensboro, NC (US)

(72) Inventors: Julio C. Costa, Oak Ridge, NC (US); Mickael Renault, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/109,935

(22) Filed: Dec. 2, 2020

(65) Prior Publication Data

US 2021/0167031 A1 Jun. 3, 2021

Related U.S. Application Data

(60) Provisional application No. 62/942,478, filed on Dec. 2, 2019.

(51) Int. Cl.
    *H01L 21/48*     (2006.01)
    *H01L 23/00*     (2006.01)
    (Continued)

(52) U.S. Cl.
    CPC .......... *H01L 24/20* (2013.01); *H01L 21/4853* (2013.01); *H01L 21/4857* (2013.01);
    (Continued)

(58) Field of Classification Search
    CPC . H01L 24/20; H01L 21/4853; H01L 21/4857; H01L 21/4871; H01L 21/565;
    (Continued)

(56) References Cited

U.S. PATENT DOCUMENTS

| | | | |
|---|---|---|---|
| 4,093,562 | A | 6/1978 | Kishimoto |
| 4,366,202 | A | 12/1982 | Borovsky |
| (Continued) | | | |

FOREIGN PATENT DOCUMENTS

| | | | |
|---|---|---|---|
| CN | 1696231 | A | 11/2005 |
| CN | 101901953 | A | 12/2010 |
| (Continued) | | | |

OTHER PUBLICATIONS

US 10,896,908 B2, 01/2021, Costa et al. (withdrawn)
(Continued)

*Primary Examiner* — Vu A Vu
(74) *Attorney, Agent, or Firm* — Withrow & Terranova, P.L.L.C.

(57) ABSTRACT

The present disclosure relates to a radio frequency (RF) device and a process for making the same. According to the process, a precursor wafer, which includes device regions, individual interfacial layers, individual p-type doped layers, and a silicon handle substrate, is firstly provided. Each individual interfacial layer is over an active layer of a corresponding device region, each individual p-type doped layer is over a corresponding individual interfacial layer, and the silicon handle substrate is over each individual p-type doped layer. Herein, each individual interfacial layer is formed of SiGe, and each individual p-type doped layer is a silicon layer doped with a p-type material that has a doped concentration greater than 1E18cm-3. Next, the silicon handle substrate is completely removed to provide an etched wafer, and each individual p-type doped layer is completely removed from the etched wafer.

21 Claims, 12 Drawing Sheets

(51) Int. Cl.
*H01L 21/56* (2006.01)
*H01L 21/683* (2006.01)
*H01L 21/78* (2006.01)
*H01L 23/31* (2006.01)
*H01L 23/367* (2006.01)
*H01L 23/538* (2006.01)
*H01L 23/66* (2006.01)

(52) U.S. Cl.
CPC ........ *H01L 21/4871* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/3135* (2013.01); *H01L 23/3672* (2013.01); *H01L 23/5383* (2013.01); *H01L 23/5386* (2013.01); *H01L 23/66* (2013.01); *H01L 24/19* (2013.01); *H01L 2221/68372* (2013.01); *H01L 2224/214* (2013.01)

(58) Field of Classification Search
CPC ... H01L 21/568; H01L 21/6835; H01L 21/78; H01L 23/3128; H01L 23/3135; H01L 23/3672; H01L 23/5383; H01L 23/5386; H01L 23/66; H01L 24/19; H01L 2221/68372; H01L 2224/214; H01L 2224/11; H01L 21/561; H01L 23/3737; H01L 23/4334; H01L 2221/68345; H01L 2221/6835; H01L 2221/68368; H01L 2224/0237; H01L 2224/04105; H01L 2224/12105; H01L 2224/94; H01L 2224/96; H01L 2924/1421; H01L 23/367
USPC .......................................................... 257/668
See application file for complete search history.

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,164,687 A | 11/1992 | Kurian et al. |
| 5,294,295 A | 3/1994 | Gabriel |
| 5,362,972 A | 11/1994 | Vazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzgerald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,064,391 B1 * | 6/2006 | Conn ................ H01L 21/76256 257/340 |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,723,838 B2 | 5/2010 | Takeuchi et al. |
| 7,749,882 B2 | 7/2010 | Kweon et al. |
| 7,790,543 B2 | 9/2010 | Abadeer et al. |
| 7,816,231 B2 * | 10/2010 | Dyer .................... H01L 23/544 438/443 |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,955,955 B2 * | 6/2011 | Lane .................... H01L 23/5329 438/465 |
| 7,960,218 B2 | 6/2011 | Ma et al. |
| 8,004,089 B2 | 8/2011 | Jobetto |
| 8,183,151 B2 | 5/2012 | Lake |
| 8,299,633 B2 * | 10/2012 | Su ........................ H01L 23/055 257/798 |
| 8,420,447 B2 | 4/2013 | Tay et al. |
| 8,503,186 B2 | 8/2013 | Lin et al. |
| 8,563,403 B1 | 10/2013 | Farooq et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabar et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B2 | 5/2017 | Hiner et al. |
| 9,698,081 B2 | 7/2017 | Yu et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |

(56) References Cited

U.S. PATENT DOCUMENTS

| | | |
|---|---|---|
| 10,882,740 B2 | 1/2021 | Costa et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2004/0266159 A1 | 12/2004 | Gardecki et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2005/0258447 A1 | 11/2005 | Oi et al. |
| 2005/0260842 A1 | 11/2005 | Kaltalioglu et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0020513 A1 | 1/2008 | Jobetto |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0251927 A1 | 10/2008 | Zhao et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0230542 A1 | 9/2009 | Lin et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0227158 A1 | 9/2011 | Zhu |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0037929 A1 | 2/2013 | Essig et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1 | 9/2013 | Tojo et al. |
| 2013/0280826 A1 | 10/2013 | Scanlan et al. |
| 2013/0299871 A1 | 11/2013 | Mauder et al. |
| 2013/0334698 A1 | 12/2013 | Mohammed et al. |
| 2014/0015131 A1 | 1/2014 | Meyer et al. |
| 2014/0021583 A1 | 1/2014 | Lo et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0323064 A1 | 10/2014 | McCarthy |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0060956 A1 | 3/2015 | Chen |
| 2015/0097302 A1 | 4/2015 | Wakisaka et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0171006 A1 | 6/2015 | Hung et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabar et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |

(56) References Cited

U.S. PATENT DOCUMENTS

| | | | |
|---|---|---|---|
| 2016/0300771 A1 | 10/2016 | Lin | |
| 2016/0343592 A1 | 11/2016 | Costa et al. | |
| 2016/0343604 A1 | 11/2016 | Costa et al. | |
| 2016/0347609 A1 | 12/2016 | Yu et al. | |
| 2016/0362292 A1 | 12/2016 | Chang et al. | |
| 2017/0024503 A1 | 1/2017 | Connelly | |
| 2017/0032957 A1 | 2/2017 | Costa et al. | |
| 2017/0033026 A1 | 2/2017 | Ho et al. | |
| 2017/0053938 A1 | 2/2017 | Whitefield | |
| 2017/0062366 A1 | 3/2017 | Enquist | |
| 2017/0077028 A1 | 3/2017 | Maxim et al. | |
| 2017/0098587 A1 | 4/2017 | Leipold et al. | |
| 2017/0190572 A1 | 7/2017 | Pan et al. | |
| 2017/0200648 A1 | 7/2017 | Lee et al. | |
| 2017/0207350 A1 | 7/2017 | Leipold et al. | |
| 2017/0263539 A1* | 9/2017 | Gowda | H01L 23/49568 |
| 2017/0271200 A1 | 9/2017 | Costa | |
| 2017/0323804 A1 | 11/2017 | Costa et al. | |
| 2017/0323860 A1 | 11/2017 | Costa et al. | |
| 2017/0334710 A1 | 11/2017 | Costa et al. | |
| 2017/0358511 A1 | 12/2017 | Costa et al. | |
| 2018/0019184 A1 | 1/2018 | Costa et al. | |
| 2018/0019185 A1 | 1/2018 | Costa et al. | |
| 2018/0044169 A1 | 2/2018 | Hatcher, Jr. et al. | |
| 2018/0044177 A1 | 2/2018 | Vandemeer et al. | |
| 2018/0047653 A1 | 2/2018 | Costa et al. | |
| 2018/0076174 A1 | 3/2018 | Costa et al. | |
| 2018/0138082 A1 | 5/2018 | Costa et al. | |
| 2018/0138227 A1 | 5/2018 | Shimotsusa et al. | |
| 2018/0145678 A1 | 5/2018 | Maxim et al. | |
| 2018/0166358 A1 | 6/2018 | Costa et al. | |
| 2018/0261470 A1 | 9/2018 | Costa et al. | |
| 2018/0269188 A1 | 9/2018 | Yu et al. | |
| 2018/0342439 A1 | 11/2018 | Costa et al. | |
| 2019/0013254 A1 | 1/2019 | Costa et al. | |
| 2019/0013255 A1 | 1/2019 | Costa et al. | |
| 2019/0043812 A1 | 2/2019 | Leobandung | |
| 2019/0057922 A1 | 2/2019 | Costa et al. | |
| 2019/0074263 A1 | 3/2019 | Costa et al. | |
| 2019/0074271 A1 | 3/2019 | Costa et al. | |
| 2019/0172826 A1* | 6/2019 | Or-Bach | H01L 27/0688 |
| 2019/0172842 A1 | 6/2019 | Whitefield | |
| 2019/0189599 A1* | 6/2019 | Baloglu | H01L 23/5389 |
| 2019/0229101 A1 | 7/2019 | Lee | |
| 2019/0287953 A1 | 9/2019 | Moon et al. | |
| 2019/0304910 A1 | 10/2019 | Fillion | |
| 2019/0304977 A1 | 10/2019 | Costa et al. | |
| 2019/0312110 A1 | 10/2019 | Costa et al. | |
| 2019/0326159 A1 | 10/2019 | Costa et al. | |
| 2019/0378819 A1 | 12/2019 | Costa et al. | |
| 2019/0378821 A1 | 12/2019 | Costa et al. | |
| 2020/0006193 A1 | 1/2020 | Costa et al. | |
| 2020/0058541 A1 | 2/2020 | Konishi et al. | |
| 2020/0115220 A1 | 4/2020 | Hammond et al. | |
| 2020/0118838 A1 | 4/2020 | Hammond et al. | |
| 2020/0176347 A1 | 6/2020 | Costa et al. | |
| 2020/0234978 A1 | 7/2020 | Costa et al. | |
| 2020/0235024 A1 | 7/2020 | Costa et al. | |
| 2020/0235040 A1 | 7/2020 | Costa et al. | |
| 2020/0235054 A1 | 7/2020 | Costa et al. | |
| 2020/0235059 A1 | 7/2020 | Cok et al. | |
| 2020/0235066 A1 | 7/2020 | Costa et al. | |
| 2020/0235074 A1 | 7/2020 | Costa et al. | |
| 2021/0134699 A1 | 5/2021 | Costa et al. | |
| 2021/0348078 A1 | 11/2021 | Haramoto et al. | |

FOREIGN PATENT DOCUMENTS

| | | |
|---|---|---|
| CN | 102956468 A | 3/2013 |
| CN | 103000537 A | 3/2013 |
| CN | 103730429 A | 4/2014 |
| CN | 103811474 A | 5/2014 |
| CN | 103872012 A | 6/2014 |
| CN | 106098609 A | 11/2016 |
| DE | 102014117594 A1 | 6/2016 |
| EP | 1098386 A1 | 5/2001 |
| EP | 2996143 A1 | 3/2016 |
| JP | S505733 Y1 | 2/1975 |
| JP | S5338954 A | 4/1978 |
| JP | H11-220077 A | 8/1999 |
| JP | 200293957 A | 3/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201733056 A | 9/2017 |
| WO | 2007074651 A1 | 7/2007 |
| WO | 2010080068 A1 | 7/2010 |
| WO | 2018083961 A1 | 5/2018 |
| WO | 2018125242 A1 | 7/2018 |

OTHER PUBLICATIONS

Notice of Allowance for U.S. Appl. No. 16/426,527, dated May 14, 2021, 9 pages.
Final Office Action for U.S. Appl. No. 16/427,019, dated May 21, 2021, 16 pages.
Advisory Action for U.S. Appl. No. 16/427,019, dated Aug. 2, 2021, 3 pages.
Final Office Action and Examiner-Initiated Interview Summary for U.S. Appl. No. 16/678,551, datedd Jun. 28, 2021, 9 pages.
Final Office Action and Examiner-Initiated Interview Summary for U.S. Appl. No. 16/678,573, dated Jun. 28, 2021, 10 pages.
Notice of Allowance for U.S. Appl. No. 16/678,619, dated Jul. 8, 2021, 10pages.
Final Office Action for U.S. Appl. No. 16/678,602, dated Jun. 1, 2021, 9 pages.
Notice of Reasons for Refusal for Japanese Patent Application No. 2020119130, dated Jun. 29, 2021, 4 pages.
Notice of Reasons for Rejection for Japanese Patent Application No. 2019507765, dated Jun. 28, 2021, 4 pages.
Search Report for Japanese Patent Application No. 2019507768, dated Jul. 15, 2021, 42 pages.
Notice of Reasons for Refusal for Japanese Patent Application No. 2019507768, dated Jul. 26, 2021, 4 pages.
Reasons for Rejection for Japanese Patent Application No. 2019507767, dated Jun. 25, 2021, 5 pages.
International Preliminary Report on Patentability for International Patent Application No. PCT/US2019/063460, dated Jun. 10, 2021, 9 pages.
International Preliminary Report on Patentability for International Patent Application No. PCT/US2019/034699, dated Aug. 5, 2021, 9 pages.
International Preliminary Report on Patentability for International Patent Application No. PCT/US2020/014662, dated Aug. 5, 2021, 11 pages.
International Preliminary Report on Patentability for International Patent Application No. PCT/US2020/014665, dated Aug. 5, 2021, 10 pages.
International Preliminary Report on Patentability for International Patent Application No. PCT/US2020/014666, dated Aug. 5, 2021, 11 pages.
International Preliminary Report on Patentability for International Patent Application No. PCT/US2020/014667, dated Aug. 5, 2021, 8 pages.

(56) References Cited

OTHER PUBLICATIONS

International Preliminary Report on Patentability for International Patent Application No. PCT/US2020/014669, dated Aug. 5, 2021, 9 pages.
Advisory Action for U.S. Appl. No. 16/390,496, dated Mar. 1, 2021, 3 pages.
Notice of Allowance for U.S. Appl. No. 16/390,496, dated Apr. 5, 2021, 7 pages.
Non-Final Office Action for U.S. Appl. No. 16/678,551, dated Apr. 7, 2021, 9 pages.
Applicant-Initiated Interview Summary for U.S. Appl. No. 16/678,573, dated May 7, 2021, 2 pages.
Supplementary Examination Report for Singapore Patent Application No. 11201901194S, dated Mar. 10, 2021, 3 pages.
International Preliminary Report on Patentability for International Patent Application No. PCT/US2019/055317, dated Apr. 22, 2021, 11 pages.
International Preliminary Report on Patentability for International Patent Application No. PCT/US2019/055321, dated Apr. 22, 2021, 14 pages.
Office Action for Taiwanese Patent Application No. 108140788, dated Mar. 25, 2021, 18 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
Non-Final Office Action for U.S. U.S. Appl. No. 16/678,573, dated Feb. 19, 2021, 11 pages.
Non-Final Office Action for U.S. Appl. No. 16/678,602, dated Feb. 19, 2021, 10 pages.
First Office Action for Chinese Patent Application No. 201680058198.6, dated Dec. 29, 2020, 14 pages.
International Preliminary Report on Patentability for International Patent Application No. PCT/US2019/025591, dated Oct. 15, 2020, 6 pages.
International Preliminary Report on Patentability for International Patent Application No. PCT/US2019/034645, dated Jan. 14, 2021, 9 pages.
Corrected Notice of Allowability for U.S. Appl. No. 16/426,527, datedd Aug. 18, 2021, 4 pages.
Advisory Action and Examiner-Initiated Interview Summary for U.S. Appl. No. 16/678,551, dated Sep. 13, 2021, 3 pages.
Notice of Allowance and Examiner-Initiated Interview Summary for U.S. Appl. No. 16/678,551, dated Oct. 21, 2021, 8 pages.
Advisory Action and Examiner-Initiated Interview Summary for U.S. Appl. No. 16/678,573, dated Sep. 10, 2021, 3 pages.
Notice of Allowance and Examiner-Initiated Interview Summary for U.S. Appl. No. 16/678,573, dated Oct. 21, 2021, 7 pages.
Non-Final Office Action for U.S. Appl. No. 16/678,586, dated Aug. 12, 2021, 16 pages.
Notice of Allowance and Examiner-Initiated Interview Summary for U.S. Appl. No. 16/678,602, dated Aug. 12, 2021, 11 pages.
Corrected Notice of Allowability for U.S. Appl. No. 16/678,602, dated Aug. 26, 2021, 4 pages.
Decision to Grant for Japanese Patent Application No. 2020119130, dated Sep. 7, 2021, 4 pages.
Second Office Action for Chinese Patent Application No. 201680058198.6, dated Sep. 8, 2021, 8 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Reporton Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged A;GAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," EEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.

(56) References Cited

OTHER PUBLICATIONS

Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, 9p. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Corrected Notice of Allowability for U.S. Appl. No. 15/695,579, dated Feb. 5, 2020, 5 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Notice of Allowance for U.S. Appl. No. 15/873,152, dated Dec. 10, 2019, 9 pages.
Borel, S. et al., "Control of Selectivity between SiGe and Si in Isotropic Etching Processes," Japanese Journal of Applied Physics, vol. 43, No. 6B, 2004, pp. 3964-3966.
Non-Final Office Action for U.S. Appl. No. 16/427,019, dated Dec. 2, 2021, 17 pages.
Corrected Notice of Allowability for U.S. Appl. No. 16/678,551, dated Nov. 24, 2021, 3 pages.
Corrected Notice of Allowability for U.S. Appl. No. 16/678,551, dated Jan. 27, 2022, 3 pages.
Corrected Notice of Allowability for U.S. Appl. No. 16/678,573, dated Nov. 24, 2021, 3 pages.
Corrected Notice of Allowability for U.S. Appl. No. 16/678,573, dated Jan. 27, 2022, 3 pages.
Final Office Action for U.S. Appl. No. 16/678,586, dated Nov. 22, 2021, 15 pages.
Advisory Action for U.S. Appl. No. 16/678,586, dated Jan. 26, 2022, 3 pages.
Corrected Notice of Allowability for U.S. Appl. No. 16/678,602, dated Nov. 24, 2021, 4 pages.
Corrected Notice of Allowability for U.S. Appl. No. 16/678,602, dated Dec. 30, 2021, 4 pages.
Decision of Rejection for Chinese Patent Application No. 201680058198.6, dated Nov. 12, 2021, 6 pages.
Examination Report for European Patent Application No. 17755402.9, dated Dec. 20, 2021, 12 pages.
Examination Report for European Patent Application No. 17755403.7, dated Dec. 20, 2021, 13 pages.
Notice of Allowance for Japanese Patent Application No. 2019507767, dated Jan. 19, 2021, 6 pages.
International Search Report and Written Opinion for International Patent Application No. PCT/US2021/043968, dated Nov. 19, 2021, 15 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.

(56) References Cited

OTHER PUBLICATIONS

Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 16/426,527, dated Feb. 16, 2022, 9 pages.
Corrected Notice of Allowability for U.S. Appl. No. 16/678,551, dated Mar. 9, 2022, 3 pages.
Corrected Notice of Allowability for U.S. Appl. No. 16/678,573, dated Mar. 31, 2022, 3 pages.
Non-Final Office Action for U.S. Appl. No. 16/678,586, dated Mar. 3, 2022, 14 pages.
Corrected Notice of Allowability for U.S. Appl. No. 16/678,602, dated Feb. 2, 2022, 4 pages.
Corrected Notice of Allowability for U.S. Appl. No. 16/678,602, dated Mar. 9, 2022, 4 pages.
Non-Final Office Action for U.S. Appl. No. 16/844,406, dated Mar. 14, 2022, 16 pages.
Non-Final Office Action for U.S. Appl. No. 17/102,957, dated Feb. 17, 2022, 9 pages.
Summons to Attend for European Patent Application No. 16751791.1, dated Feb. 28, 2022, 10 pages.
Decision to Grant for Japanese Patent Application No. 2019507765, dated Feb. 10, 2022, 6 pages.
Decision to Grant for Japanese Patent Application No. 2019507768, dated Feb. 10, 2022, 6 pages.
Office Letter for Taiwanese Patent Application No. 108140788, dated Jan. 5, 2022, 16 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.

(56) References Cited

OTHER PUBLICATIONS

Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007,1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.

(56) References Cited

OTHER PUBLICATIONS

Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III—V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazur3, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 16/527,702, dated Jan. 10, 2020, 10 pages.
Office Action for Japanese Patent Application No. 2018-526613, dated Nov. 5, 2019, 8 pages.
Intention to Grant for European Patent Application No. 17757646.9, dated Feb. 27, 2020, 55 pages.
International Search Report and Written Opinion for International Patent Application No. PCT/US2019/034645, dated Sep. 19, 2019, 14 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
International Search Report and Written Opinion for International Patent Application No. PCT/US2019/034699, dated Oct. 29, 2019, 13 pages.
Corrected Notice of Allowability for U.S. Appl. No. 15/695,579, dated Apr. 1, 2020, 4 pages.
Final Office Action for U.S. Appl. No. 16/204,214, dated Mar. 6, 2020, 14 pages.
Notice of Allowance for U.S. Appl. No. 15/816,637, dated Apr. 2, 2020, 8 pages.
Notice of Allowance for U.S. Appl. No. 16/527,702, dated Apr. 9, 2020, 8 pages.
Decision of Rejection for Japanese Patent Application No. 2015-180657, dated Mar. 17, 2020, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 16/004,961, dated Apr. 30, 2020, 8 pages.
Advisory Action for U.S. Appl. No. 16/204,214, dated Apr. 15, 2020, 3 pages.
Examination Report for European Patent Application No. 16751791.1, dated Apr. 30, 2020, 15 pages.
Notification of Reasons for Refusal for Japanese Patent Application No. 2018-526613, dated May 11, 2020, 5 pages.
Notice of Allowance for U.S. Appl. No. 15/873,152, dated May 11, 2020, 8 pages.
Non-Final Office Action for U.S. Appl. No. 16/454,687, dated May 15, 2020, 14 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Zeng, X. et al., "A Combination of Boron Nitride Nanotubes and Cellulose Nanofibers for the Preparation of a Nanocomposite with High Thermal Conductivity," ACS Nano, vol. 11, No. 5, 2017, American Chemical Society, pp. 5167-5178.
Quayle Action for U.S. Appl. No. 16/703,251, dated Jun. 26, 2020, 5 pages.
Corrected Notice of Allowability for U.S. Appl. No. 15/695,579, dated May 20, 2020, 4 pages.
Notice of Allowability for U.S. Appl. No. 15/695,579, dated Jun. 25, 2020, 4 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Non-Final Office Action for U.S. Appl. No. 16/204,214, mailed May 19, 2020, 15 pages.
Non-Final Office Action for U.S. Appl. No. 16/454,809, dated May 15, 2020, 12 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Notice of Allowance for U.S. Appl. No. 16/454,687, dated Aug. 14, 2020, 7 pages.
Decision to Grant for Japanese Patent Application No. 2018-526613, dated Aug. 17, 2020, 5 pages.
Final Office Action for U.S. Appl. No. 16/454,809, dated Aug. 21, 2020, 12 pages.
Von Trapp, F., "Hybrid Bonding: From Concept to Commercialization," Apr. 2, 2018, 3D InCities, https://www.3dincites.com/2018/04/hybrid-bonding-from-concept-to-commercialization/, 10 pages.
Notice of Allowance for U.S. Appl. No. 16/703,251, dated Aug. 27, 2020, 8 pages.
Notice of Allowance for U.S. Appl. No. 16/527,702, dated Nov. 13, 2020, 8 pages.

(56) References Cited

OTHER PUBLICATIONS

Notice of Allowance for U.S. Appl. No. 16/374,125, dated Dec. 16, 2020, 9 pages.
Final Office Action for U.S. Appl. No. 16/390,496, dated Dec. 24, 2020, 21 pages.
Non-Final Office Action for U.S. Appl. No. 16/426,527, dated Nov. 20, 2020, 7 pages.
Final Office Action for U.S. Appl. No. 16/204,214, dated Nov. 30, 2020, 15 pages.
Notice of Allowance for U.S. Appl. No. 16/204,214, dated Feb. 17, 2021, 11 pages.
Advisory Action for U.S. Appl. No. 16/454,809, dated Oct. 23, 2020, 3 pages.
Quayle Action for U.S. Appl. No. 16/426,527, dated May 26, 2022, 5 pages.
Final Office Action for U.S. Appl. No. 16/427,019, dated Apr. 12, 2022, 15 pages.
Advisory Action for U.S. Appl. No. 16/427,019, dated Jun. 2, 2022, 3 pages.
Corrected Notice of Allowability for U.S. Appl. No. 16/678,551, dated May 13, 2022, 3 pages.
Corrected Notice of Allowability for U.S. Appl. No. 16/678,551, dated Jun. 15, 2022, 3 pages.
Corrected Notice of Allowability for U.S. Appl. No. 16/678,573, dated May 6, 2022, 3 pages.
Corrected Notice of Allowability for U.S. Appl. No. 16/678,573, dated Jun. 10, 2022, 3 pages.
Corrected Notice of Allowability for U.S. Appl. No. 16/678,602, dated Apr. 8, 2022, 4 pages.
Corrected Notice of Allowability for U.S. Appl. No. 16/678,602, dated May 13, 2022, 4 pages.
Corrected Notice of Allowability for U.S. Appl. No. 16/678,602, dated Jun. 10, 2022, 4 pages.
International Search Report and Written Opinion for International Patent Application No. PCT/US2021/063093, dated May 4, 2022, 15 pages.
Invitation to Pay Additional Fees and Partial International Search for International Patent Application No. PCT/US2021/063094, dated Apr. 19, 2022, 15 pages.
International Search Report and Written Opinion for International Patent Application No. PCT/US2021/062509, dated Mar. 29, 2022, 20 pages.
Corrected Notice of Allowability for U.S. Appl. No. 16/678,551, dated Jul. 14, 2022, 3 pages.
Corrected Notice of Allowability for U.S. Appl. No. 16/678,602, dated Jul. 14, 2022, 4 pages.
Final Office Action for U.S. Appl. No. 16/844,406, dated Jun. 24, 2022, 17 pages.
Notice of Allowance for U.S. Appl. No. 16/426,527, dated Aug. 17, 2022, 7 pages.
Non-Final Office Action for U.S. Appl. No. 16/427,019, dated Aug. 15, 2022, 17 pages.
Final Office Action for U.S. Appl. No. 16/678,586, dated Sep. 1, 2022, 7 pages.
Advisory Action for U.S. Appl. No. 16/844,406, dated Jul. 26, 2022, 3 pages.
Final Office Action for U.S. Appl. No. 17/102,957, dated Aug. 18, 2022, 12 pages.
International Search Report and Written Opinion for International Patent Application No. PCT/US2021/063094, dated Aug. 9, 2022, 24 pages.
Corrected Notice of Allowability for U.S. Appl. No. 16/678,551, dated Sep. 2, 2022, 3 pages.
Corrected Notice of Allowability for U.S. Appl. No. 16/678,602, dated Sep. 2, 2022, 4 pages.
Notice of Allowance and Examiner-Initiated Interview Summary for U.S. Appl. No. 16/678,586, dated Sep. 13, 2022, 11 pages.
Corrected Notice of Allowability for U.S. Appl. No. 16/678,602, dated Oct. 5, 2022, 4 pages.
Non-Final Office Action for U.S. Appl. No. 16/844,406, dated Oct. 6, 2022, 17 pages.
Notice of Preliminary Rejection for Korean Patent Application No. 10-2018-7006660, dated Sep. 3, 2022, 6 pages.
Non-Final Office Action for U.S. Appl. No. 17/330,787, dated Oct. 17, 2022, 10 pages.
Advisory Action for U.S. Appl. No. 17/102,957, dated Oct. 27, 2022, 7 pages.
Notice of Allowance for U.S. Appl. No. 16/390,496, dated Oct. 27, 2022, 21 pages.
Notice of Allowance for U.S. Appl. No. 16/204,214, dated Oct. 28, 2022, 11 pages.
Notice of Allowance for U.S. Appl. No. 17/330,787, dated Dec. 15, 2022, 7 pages.
Final Office Action for U.S. Appl. No. 16/427,019, dated Dec. 12, 2022, 19 pages.
Corrected Notice of Allowability for U.S. Appl. No. 16/678,551, dated Oct. 4, 2022, 3 pages.
Corrected Notice of Allowability for U.S. Appl. No. 16/678,551, dated Nov. 2, 2022, 3 pages.
Corrected Notice of Allowability for U.S. Appl. No. 16/678,551, dated Dec. 7, 2022, 3 pages.
Non-Final Office Action for U.S. Appl. No. 17/573,112, dated Dec. 9, 2022, 6 pages.
Corrected Notice of Allowability for U.S. Appl. No. 16/678,602, dated Nov. 14, 2022, 4 pages.
Corrected Notice of Allowability for U.S. Appl. No. 16/678,602, dated Dec. 9, 2022, 4 pages.
Non-Final Office Action for U.S. Appl. No. 17/554,477, dated Nov. 25, 2022, 6 pages.
First Office Action for Chinese Patent Application No. 201780062516.0, dated Nov. 2, 2022, 10 pages.
Notice of Reasons for Rejection for Japanese Patent Application No. 2022032477, dated Oct. 3, 2022, 4 pages.
First Office Action for Chinese Patent Application No. 201780058052.6, dated Nov. 2, 2022, 22 pages.
Non-Final Office Action for U.S. Appl. No. 16/426,527, dated Feb. 9, 2023, 9 pages.
First Office Action for Chinese Patent Application No. 201780063121.2, dated Nov. 23, 2022, 12 pages.
Preliminary Examination Report for Taiwanese Patent Application No. 108140788, dated Dec. 9, 2022, 13 pages.

\* cited by examiner

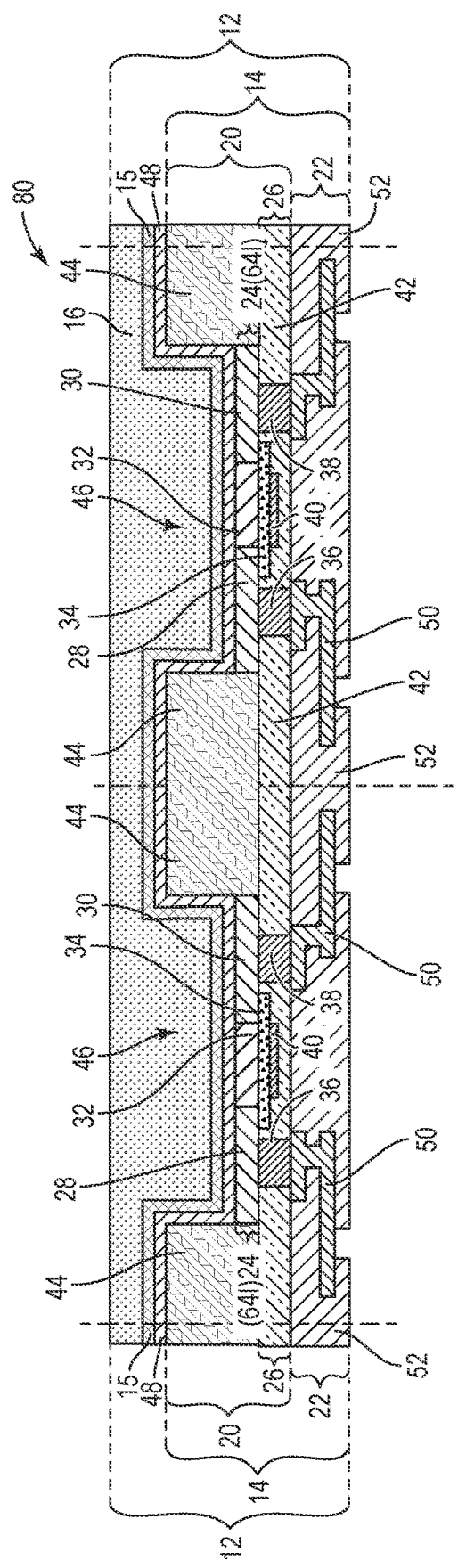
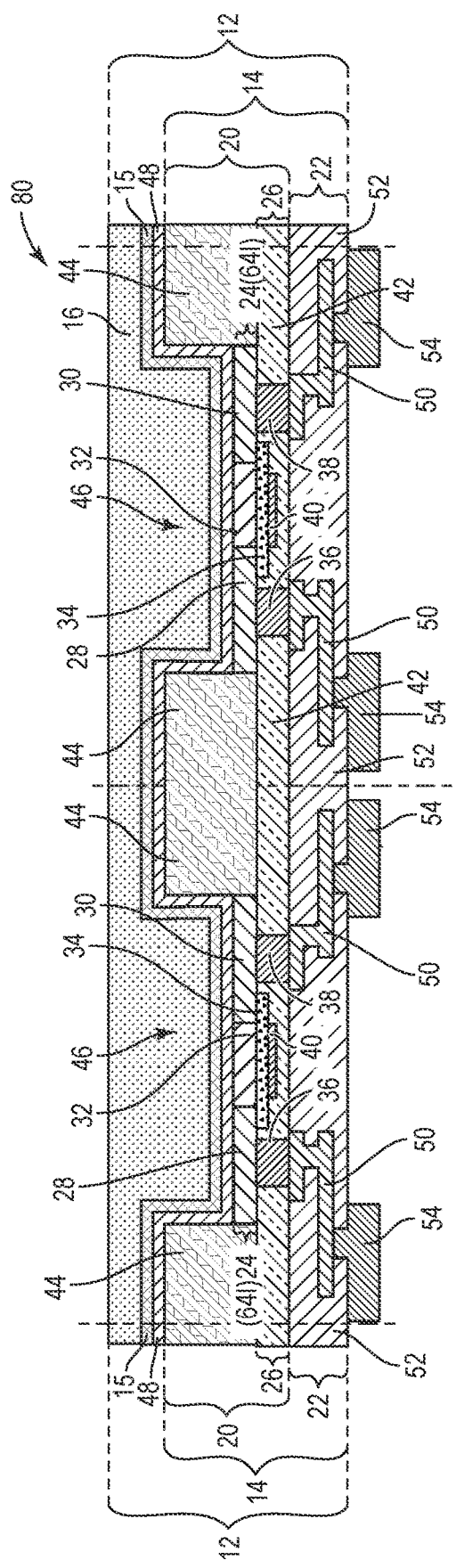
FIG. 12
FIG. 13

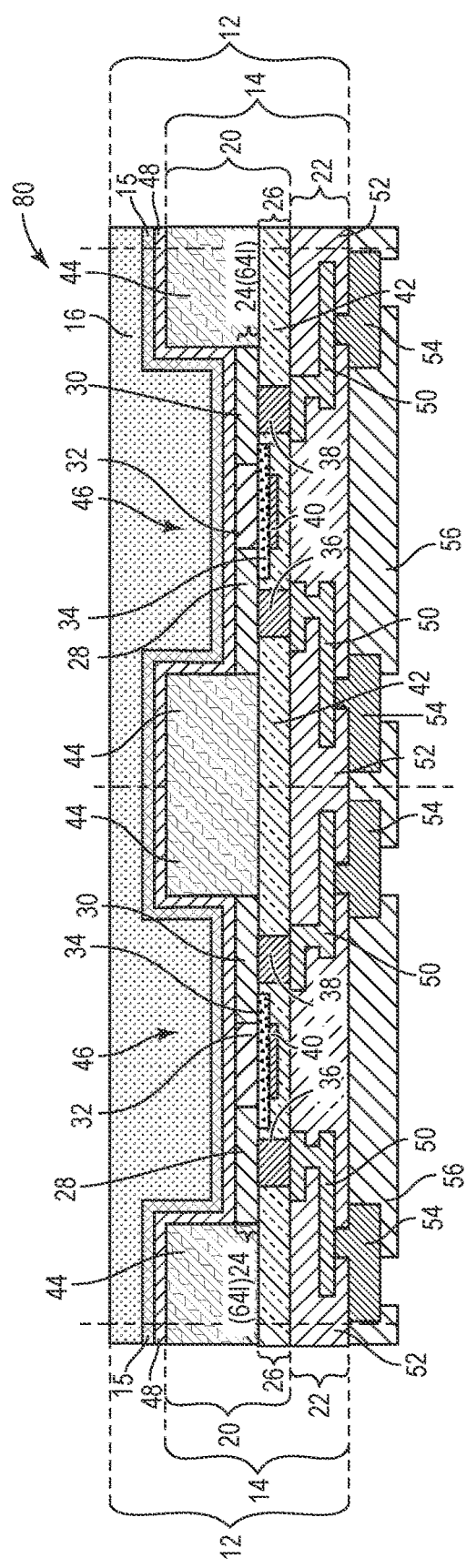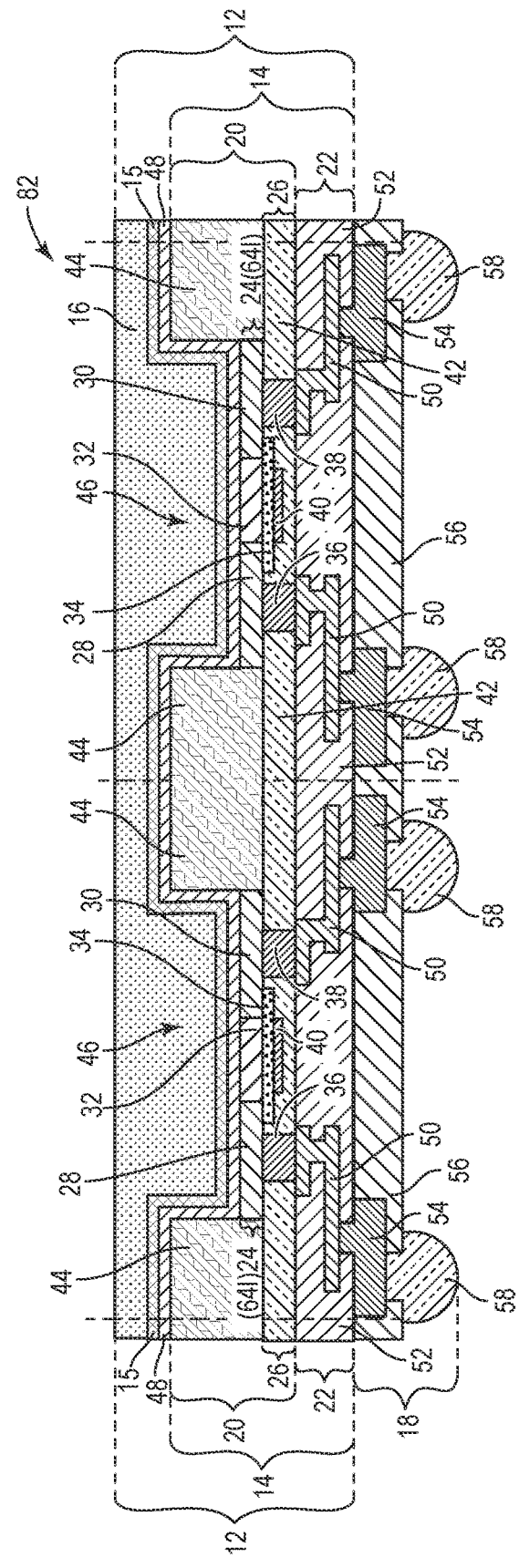

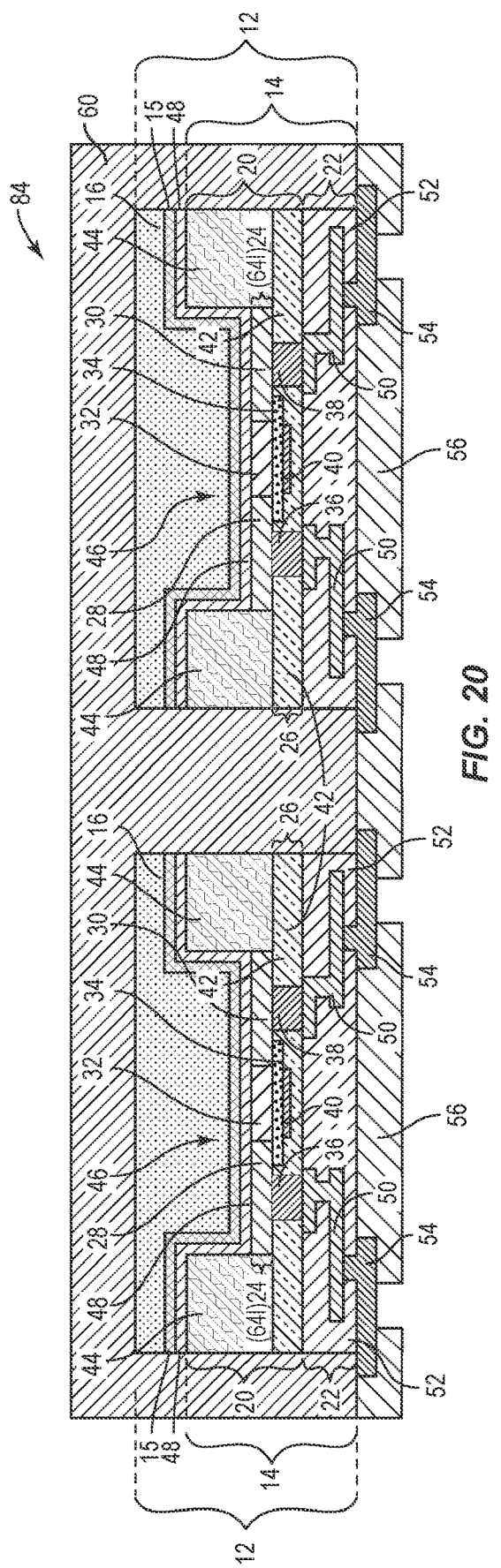
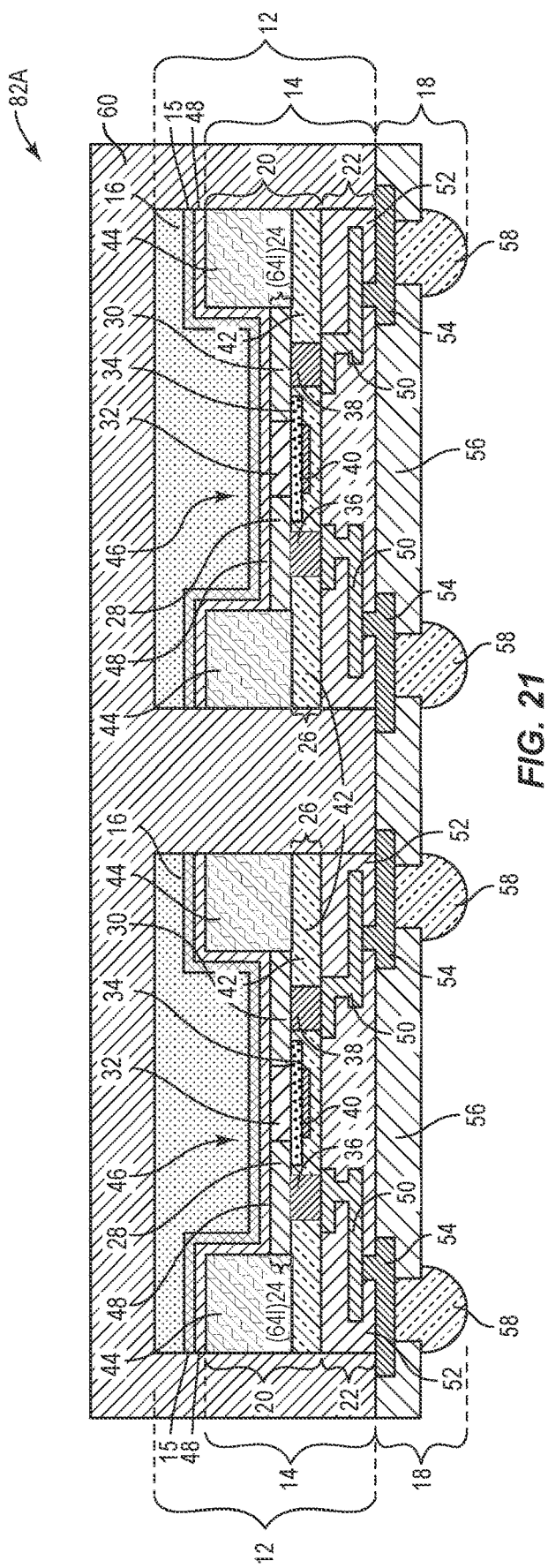

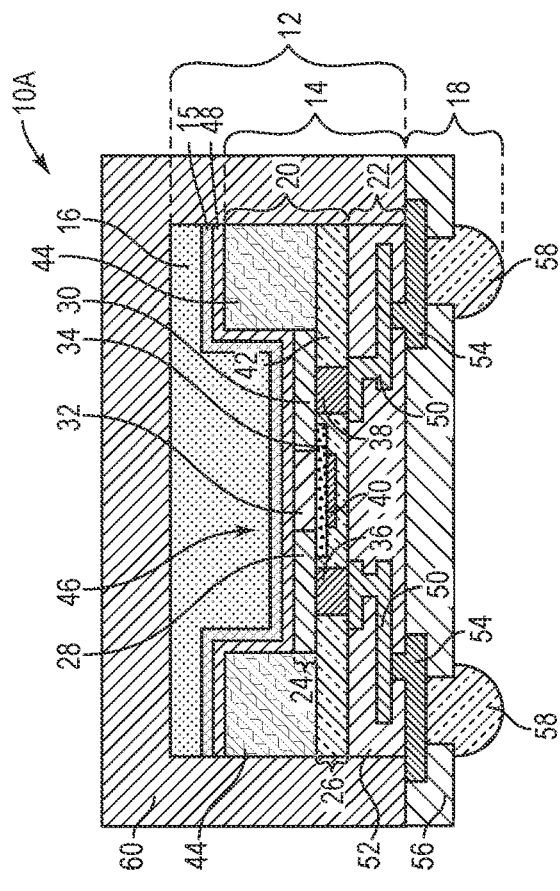
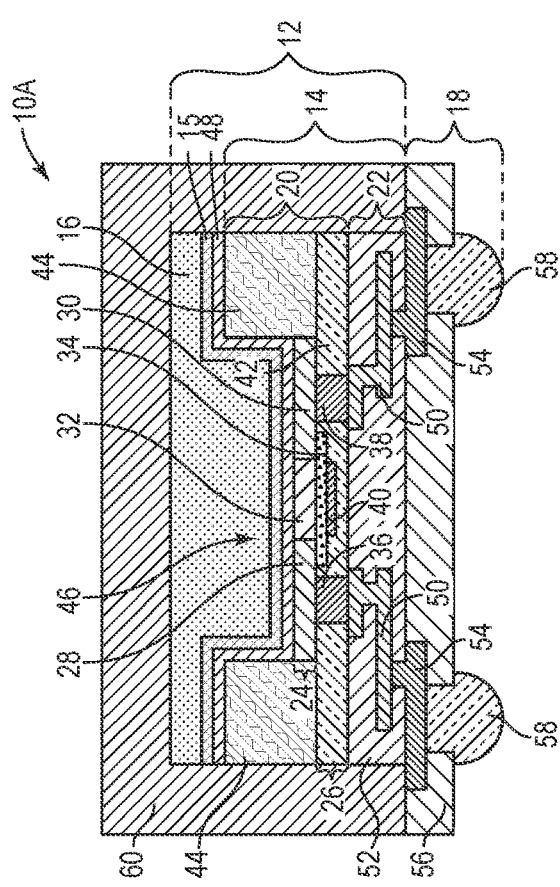
FIG. 22

RF DEVICES WITH ENHANCED PERFORMANCE AND METHODS OF FORMING THE SAME

RELATED APPLICATIONS

This application claims the benefit of provisional patent application Ser. No. 62/942,478, filed Dec. 2, 2019, the disclosure of which is hereby incorporated herein by reference in its entirety.

FIELD OF THE DISCLOSURE

The present disclosure relates to a radio frequency (RF) device and a process for making the same, and more particularly to an RF device with enhanced thermal and electrical performance, and a wafer-level fabricating and packaging process to provide the RF device with enhanced performance.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques. Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates.

In addition, high speed and high performance transistors are more densely integrated in RF devices. Consequently, the amount of heat generated by the RF devices will increase significantly due to the large number of transistors integrated in the RF devices, the large amount of power passing through the transistors, and/or the high operation speed of the transistors. Accordingly, it is desirable to package the RF devices in a configuration for better heat dissipation.

Wafer-level fan-out (WLFO) technology and embedded wafer-level ball grid array (eWLB) technology currently attract substantial attention in portable RF applications. WLFO and eWLB technologies are designed to provide high density input/output (I/O) ports without increasing the size of a package. This capability allows for densely packaging the RF devices within a single wafer.

To enhance the operation speed and performance of the RF devices, to accommodate the increased heat generation of the RF devices, to reduce deleterious harmonic distortion of the RF devices, and to utilize advantages of WLFO/eWLB technologies, it is therefore an object of the present disclosure to provide an improved wafer-level fabricating and packaging process for fabricating the RF devices with enhanced performance. Further, there is also a need to enhance the performance of the RF devices without increasing the device size.

SUMMARY

The present disclosure relates to a radio frequency (RF) device with enhanced performance, and a process for making the same. The disclosed RF device includes a mold device die and a multilayer redistribution structure. The mold device die includes a device region with a front-end-of-line (FEOL) portion and a back-end-of-line (BEOL) portion, a passivation layer, a thermally conductive film, and a first mold compound. Herein, the FEOL portion resides over the BEOL portion and includes an active layer and isolation sections, which surround the active layer and extend vertically beyond a top surface of the active layer to define an opening within the isolation sections and over the active layer. The passivation layer extends over an entire backside of the device region, such that the passivation layer continuously resides over exposed surfaces within the opening and top surfaces of the isolation sections. The thermally conductive film, which has a thermal conductivity greater than 10 W/m·K and an electrical resistivity greater than 1E5 Ohm-cm, resides over the passivation layer. The first mold compound resides over the thermally conductive film. Silicon crystal, which has no germanium, nitrogen, or oxygen content, does not exist between the first mold compound and the active layer of the FEOL portion. The multilayer redistribution structure, which includes a number of bump structures, is formed underneath the BEOL portion of the mold device die. The bump structures are on a bottom surface of the multilayer redistribution structure, and electrically coupled to the FEOL portion of the mold device die.

According to another embodiment, an alternative RF device includes a mold device die and a multilayer redistribution structure. The mold device die includes a device region with a front-end-of-line (FEOL) portion and a back-end-of-line (BEOL) portion, a passivation layer, a thermally conductive film, and a first mold compound. Herein, the FEOL portion resides over the BEOL portion and includes an active layer and isolation sections, which surround the active layer and extend vertically beyond a top surface of the active layer to define an opening within the isolation sections and over the active layer. The passivation layer extends over an entire backside of the device region, such that the passivation layer continuously resides over exposed surfaces within the opening and top surfaces of the isolation sections. The thermally conductive film, which has a thermal conductivity greater than 10 W/m·K and an electrical resistivity greater than 1E5 Ohm-cm, resides over the passivation layer. The first mold compound resides over the thermally conductive film. Silicon crystal, which has no germanium, nitrogen, or oxygen content, does not exist between the first mold compound and the active layer of the FEOL portion. The multilayer redistribution structure, which is formed underneath the BEOL portion of the mold device die, extends horizontally beyond the mold device die. The multilayer redistribution structure includes a number of bump structures, which are on a bottom surface of the multilayer redistribution structure, and electrically coupled to the FEOL portion of the mold device die. The alternative RF device further includes a second mold compound residing over the multilayer redistribution structure to encapsulate the mold device die.

According to an exemplary process, a precursor wafer, which includes a number of device regions, a number of individual interfacial layers, a number of individual p-type doped layers, and a silicon handle substrate, is firstly provided. Each device region includes a BEOL portion and a FEOL portion over the BEOL portion. The FEOL portion has isolation sections and an active layer, which is surrounded by the isolation sections and does not extend vertically beyond the isolation sections. Herein, each individual interfacial layer is over one active layer of a corresponding device region, each individual p-type doped layer is over a corresponding individual interfacial layer, and the silicon handle substrate is over each individual p-type doped layer. Each individual interfacial layer is formed of SiGe. Each individual p-type doped layer is a silicon layer doped with a p-type material that has a doped concentration greater than 1E18 cm-3. Next, the silicon handle substrate is completely removed to provide an etched wafer. Each individual p-type doped layer is completely removed from the etched wafer.

According to another embodiment, the exemplary process further includes removing each individual interfacial layer from the etched wafer after removing each individual p-type doped layer.

In one embodiment of the exemplary process, the p-type material is boron, which has a concentration of 1E19 cm-3 or higher within each individual p-type doped layer.

In one embodiment of the exemplary process, each individual interfacial layer has a thickness between 100 Å and 1000 Å, each individual p-type doped layer has a thickness between 100 Å and 5000 Å, and the silicon handle substrate has a thickness between 200 μm and 700 μm.

According to another embodiment, the exemplary process further includes applying a passivation layer over an entire backside of the etched wafer after removing each individual p-type doped layer. Herein, the passivation layer covers the top surface of each active layer and the top surface of each isolation section. The passivation layer is formed of silicon dioxide with a thickness between 10 Å and 1000 Å.

According to another embodiment, the exemplary process further includes removing each individual interfacial layer from the etched wafer after removing each individual p-type doped layer and before applying the passivation layer. Herein, the active layer of each device region is in contact with the passivation layer.

According to another embodiment, the exemplary process further includes applying a thermally conductive film over the passivation layer. The thermally conductive film has a thermal conductivity greater than 10 w/m·k and an electrical resistivity greater than 1E5 Ohm-cm.

In one embodiment of the exemplary process, the thermally conductive film is formed of one of silicon nitride, aluminum nitride, alumina, boron-nitride, and a diamond-based material. The thermally conductive film has a thickness between 100 Å to 50 μm.

In one embodiment of the exemplary process, the thermally conductive film is formed from carbon nanotube rich layers.

According to another embodiment, the exemplary process further includes applying a first mold compound over the thermally conductive film to provide a mold device wafer that includes a number of mold device dies. Herein, silicon crystal, which has no germanium, nitrogen, or oxygen content, does not exist between the active layer of each of the plurality of device regions and the first mold compound. Each mold device die includes a corresponding device region, a portion of the passivation layer over the corresponding device region, a portion of the thermally conductive film over the portion of the passivation layer, and a portion of the first mold compound over the portion of the thermally conductive film.

According to another embodiment, the exemplary process further includes bonding the precursor wafer to a temporary carrier via a bonding layer before the silicon handle substrate is removed, and debonding the temporary carrier and cleaning the bonding layer from the mold device wafer after the first mold compound is applied.

According to another embodiment, the exemplary process further includes forming a multilayer redistribution structure underneath the mold device wafer. Herein, the multilayer redistribution structure includes a number of bump structures on a bottom surface of the multilayer redistribution structure and redistribution interconnections within the multilayer redistribution structure. Each bump structure is electrically coupled to one active layer of a corresponding mold device die via the redistribution interconnections and connecting layers within the BEOL portion of the corresponding mold device die.

According to another embodiment, the exemplary process further includes singulating the mold device wafer into a number of individual mold device dies, and applying a second mold compound around and over each individual mold device die to provide a double mold device wafer. The second mold compound encapsulates a top surface and side surfaces of each individual mold device die, while a bottom surface of each individual mold device die is exposed. A bottom surface of the double mold device wafer is a combination of the bottom surface of each individual mold device die and a bottom surface of the second mold compound. Also the exemplary process includes forming a multilayer redistribution structure underneath the double mold device wafer. Herein, the multilayer redistribution structure comprises a number of bump structures on a bottom surface of the multilayer redistribution structure and redistribution interconnections within the multilayer redistribution structure. Each bump structure is electrically coupled to one active layer of a corresponding individual mold device die via the redistribution interconnections within the multilayer redistribution structure and connecting layers within the BEOL portion of the corresponding individual mold device die.

In one embodiment of the exemplary process, the first mold compound and the second mold compound are formed of different materials.

In one embodiment of the exemplary process, providing the precursor wafer starts with providing a starting wafer that includes a common silicon epitaxial layer, a common interfacial layer over the common silicon epitaxial layer, a common p-type doped layer over the common interfacial layer, and the silicon handle substrate over the common p-type doped layer. The common interfacial layer is formed of SiGe, and the common p-type doped layer is a silicon layer doped with the p-type material that has a doped concentration greater than 1E18 cm-3. Next, a complementary metal-oxide-semiconductor (CMOS) process is performed to the starting wafer to provide the precursor wafer. The isolation sections extend through the common silicon epitaxial layer, the common interfacial layer, the common p-type doped layer, and extend into the silicon handle substrate, such that the common p-type doped layer is separated into a number of individual p-type doped layers, the common interfacial layer is separated into a number of individual interfacial layers, and the common silicon epitaxial layer is separated into a number of individual silicon epitaxial layers. Each active layer of the device regions is formed from a corresponding individual silicon epitaxial layer. Each individual interfacial layer resides over a top surface of a corresponding active layer, each individual p-type doped layer resides over the corresponding individual interfacial layer, and the silicon handle substrate resides over each individual p-type doped layer.

In one embodiment of the exemplary process, the silicon handle substrate and the plurality of individual p-type doped layers are removed by different etching processes.

In one embodiment of the exemplary process, the silicon handle substrate is removed by a mechanical grinding process followed by an etching process. Herein, the etching process is provided by a wet etching system with an etchant chemistry, which is at least one of tetramethylammonium hydroxide (TMAH), potassium hydroxide (KOH), sodium hydroxide (NaOH), hydrofluoric-nitric-acetic (HNA) etchant, hydrofluoric-nitric acid (HF/HNO3), and xenon difluoride (XeF2).

In one embodiment of the exemplary process, the silicon handle substrate is removed by a mechanical grinding process followed by an etching process. Herein, the etching process is provided by a reactive ion etching system with a chlorine-based gas chemistry or a fluorine-based gas chemistry.

In one embodiment of the exemplary process, each individual interfacial layer is removed by a dry etch system capable of identifying the presence of the germanium atoms.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3-16 show an exemplary wafer-level fabricating and packaging process that illustrates steps to provide the exemplary RF device shown in FIG. 1.

FIGS. 17-22 show an alternative wafer-level fabricating and packaging process that illustrates steps to provide the alternative RF device shown in FIG. 2.

Figure 1:
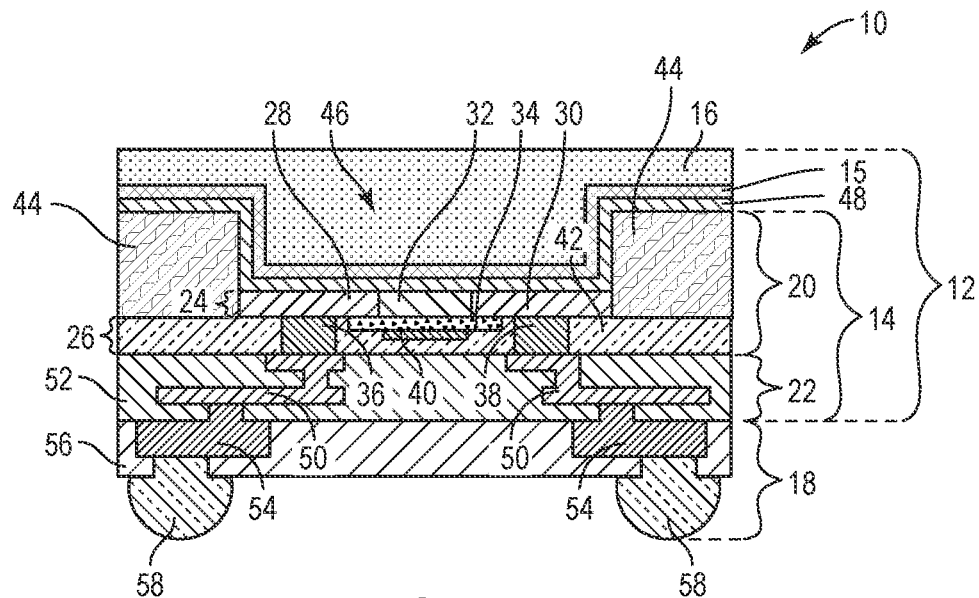
FIG. 1 shows an exemplary radio frequency (RF) device with enhanced performance according to one embodiment of the present disclosure.

It will be understood that for clear illustrations, FIGS. 1-22 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "over" or "under" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

With the looming shortage of conventional radio frequency silicon on insulator (RFSOI) wafers expected in the coming years, alternative technologies are being devised to get around the need for high resistivity using silicon wafers, the trap rich layer formation, and Smart-Cut SOI wafer process. One alternative technology is based on the use of a silicon germanium (SiGe) interfacial layer instead of a buried oxide layer (BOX) between a silicon substrate and a silicon epitaxial layer. However, this technology will still suffer from the deleterious distortion effects due to the silicon substrate, similar to what is observed in an RFSOI technology. The present disclosure, which relates to a radio frequency (RF) device with enhanced performance, and a wafer-level fabricating and packaging process for making the same, utilizes the SiGe interfacial layer and a p-type doped layer (details in the following paragraphs) without deleterious distortion effects from the silicon substrate.

FIG. 1 shows an exemplary RF device 10 with enhanced performance according to one embodiment of the present disclosure. For the purpose of this illustration, the exemplary RF device 10 includes a mold device die 12 that has a device region 14, a thermally conductive film 15, a first mold compound 16, and a multilayer redistribution structure 18 formed under the device region 14 of the mold device die 12.

In detail, the device region 14 includes a front-end-of-line (FEOL) portion 20 and a back-end-of-line (BEOL) portion 22 underneath the FEOL portion 20. In one embodiment, the FEOL portion 20 may be configured to provide a switch field-effect transistor (FET), and includes an active layer 24 and a contact layer 26. The active layer 24 has a source 28, a drain 30, and a channel 32 between the source 28 and the drain 30. The source 28, the drain 30, and the channel 32 are formed from a same silicon epitaxial layer. The contact layer 26 is formed underneath the active layer 24 and includes a gate structure 34, a source contact 36, a drain contact 38, and a gate contact 40. The gate structure 34 may be formed of silicon oxide, and extends horizontally underneath the channel 32 (i.e., from underneath the source 28 to underneath the drain 30). The source contact 36 is connected to and under the source 28, the drain contact 38 is connected to and under the drain 30, and the gate contact 40 is connected to and under the gate structure 34. An insulating material 42 may be formed around the source contact 36, the drain contact 38, the gate structure 34, and the gate contact 40 to electrically separate the source 28, the drain 30, and the gate structure 34. In different applications, the FEOL portion 20 may have different FET configurations or provide different device components, such as a diode, a capacitor, a resistor, and/or an inductor.

In addition, the FEOL portion 20 also includes isolation sections 44, which reside over the insulating material 42 of the contact layer 26 and surround the active layer 24. The isolation sections 44 are configured to electrically separate the RF device 10, especially the active layer 24, from other devices formed in a common wafer (not shown). Herein, the isolation sections 44 may extend from a top surface of the contact layer 26 and vertically beyond a top surface of the active layer 24 to define an opening 46 that is within the isolation sections 44 and over the active layer 24. The isolation sections 44 may be formed of silicon dioxide, which may be resistant to etching chemistries such as tetramethylammonium hydroxide (TMAH), potassium hydroxide (KOH), sodium hydroxide (NaOH), hydrofluoric-nitric-acetic (HNA) etchant, hydrofluoric-nitric acid (HF/HNO3), or xenon difluoride (XeF2), and may be resistant to a dry etching system, such as a reactive ion etching (RIE) system with a chlorine-based gas chemistry or a fluorine-based gas chemistry.

In some applications, the active layer 24 may be passivated to achieve proper low levels of current leakage in the device. The passivation may be accomplished with deposition of a passivation layer 48. The passivation layer 48 extends over an entire backside of the device region 14, such that the passivation layer 48 continuously covers exposed surfaces within the opening 46 and top surfaces of the isolation sections 44. In one embodiment, the passivation layer 48 may only be deposited over the top surface of the active layer 24 and within the opening 46 and the isolation sections 44 are not covered by the thermally conductive film 15 (not shown). The passivation layer 48 may be formed of silicon dioxide with a thickness between 10 Å and 1000 Å.

In some applications, the RF device 10 may further include an interfacial layer, which is formed of SiGe, over the top surface of the active layer 24 and within the opening 46 (described in the following paragraphs and not shown herein). If the passivation layer 48 and the interfacial layer exist, the interfacial layer is vertically between the active layer 24 and the passivation layer 48.

The thermally conductive film 15 extends over an entire backside of the device region 14, such that the thermally conductive film 15 continuously covers exposed surfaces within the opening 46 and top surfaces of the isolation sections 44. If the passivation layer 48 exists, the thermally conductive film 15 resides over the passivation layer 48. If the passivation layer 48 is omitted, the thermally conductive film 15 may be in contact with the active layer 24 of the FEOL portion 20 (not shown). Note that the thermally conductive film 15 is always adjacent to the active layer 24.

The thermally conductive film 15 has a high thermal conductivity between 10 W/m·K and 3000 W/m·K, and a high electrical resistivity between 1E5 Ohm-cm and 1E12 Ohm-cm. The thermally conductive film 15 may include nitrides and or ceramics, such as silicon nitride, aluminum nitride, alumina, boron nitride, diamond-based materials, and the like. In addition, the thermally conductive film 15 may be formed from carbon nanotube rich layers. Heat generated in the device region 14 may travel upward to an area above the active layer 24, pass laterally in the area above the active layer 24, and then pass downward through the device region 14 and toward the multilayer redistribution structure 18, which will dissipate the heat. It is therefore highly desirable to have a high thermal conductivity region adjacent to the active layer 24 to conduct most of the heat generated by the device region 14. Consequently, the higher the thermal conductivity in the adjacent region above the active layer 24, the better the heat dissipation performance of the device region 14. Depending on different deposition stresses and different deposited materials, the thermally conductive film 15 may have different thicknesses varying from 100 Å to 50 μm. For a diamond-based material, such as chemical vapor deposition (CVD) diamond, which may have an extremely high thermal conductivity between 1000 W/m·K and 3000 W/m·K, a very thin thickness of the thermally conductive film 15, such as between 100 Å and 1000 Å, will be extremely effective for the heat dissipation management of the device region 14. In the case of aluminum nitride, the thermal conductivity is the order of 180 W/m·K and the thermally conductive film 15 may need to be relatively thick for thermal behavior enhancement, such as between 1 μm and 20 μm. In the case of silicon nitride, the thermal conductivity is between 10 W/m·K and 40 W/m·K, and the thermally conductive film 15 may have a thickness between 30 μm and 40 μm.

In addition, the thermally conductive film 15 may also be engineered so as to provide additional tensile strain to the active layer 24. Such strain may be beneficial in providing additional improvement of electron mobility in n-channel devices. In some applications, the thermally conductive film 15 formed of silicon nitride may further passivate the active layer 24. In such case, there may be no need for the passivation layer 48 described above.

The first mold compound 16 is directly over the thermally conductive film 15 and fills the opening 46. Although the first mold compound 16 is not immediately above the active layer 24, the first mold compound 16 is still close to the active layer 24. Consequently, it is also desirable for the first mold compound 16 to have a relatively high thermal conductivity and a relatively high electrical resistivity. In this embodiment, the first mold compound 16 may have a lower thermal conductivity than the thermally conductive film 15. The first mold compound 16 has a thermal conductivity between 1 W/m·K and 100 W/m·K, or between 7 W/m·K and 20 W/m·K. In addition, the first mold compound 16 may have a low dielectric constant less than 8, or between 3 and 5 to yield low RF coupling.

The first mold compound 16 may be formed of thermoplastics or thermoset polymer materials, such as polyphenylene sulfide (PPS), overmold epoxies doped with boron nitride, alumina, carbon nanotubes, or diamond-like thermal additives, or the like. A thickness of the first mold compound 16 is based on the required thermal performance of the RF device 10, the device layout, the distance from the multilayer redistribution structure 18, as well as the specifics of the package and assembly. The first mold compound 16 may have a thickness between 200 μm and 500 μm. Notice that, regardless of the presence of the thermally conductive film 15, the passivation layer 48, and/or the interfacial layer, silicon crystal, which has no germanium, nitrogen, or oxygen content, may not exist between the first mold compound 16 and the top surface of the active layer 24. Each of the thermally conductive film 15, the passivation layer 48, and the interfacial layer is formed of silicon composite.

Further, in some applications, the top surface of each isolation section 44 and the top surface of the active layer 24 may be coplanar (not shown), and the opening 46 is omitted. The thermally conductive film 15 resides over both the active layer 24 and the isolation sections 44 of the FEOL portion 20, and the first mold compound 16 resides over the thermally conductive film 15. Note that the active layer 24 never extends vertically beyond the isolation sections 44, otherwise the isolation sections 44 may not fully separate the active layer 24 from other devices formed from the same wafer.

The BEOL portion 22 is underneath the FEOL portion 20 and includes multiple connecting layers 50 formed within dielectric layers 52. Some of the connecting layers 50 (for internal connection) are encapsulated by the dielectric layers 52 (not shown), while some of the connecting layers 50 have a bottom portion not covered by the dielectric layers 52. Certain connecting layers 50 are electrically connected to the FEOL portion 20. For the purpose of this illustration, one of the connecting layers 50 is connected to the source contact 36, and another connecting layer 50 is connected to the drain contact 38.

The multilayer redistribution structure 18, which is formed underneath the BEOL portion 22 of the mold device die 12, includes a number of redistribution interconnections 54, a dielectric pattern 56, and a number of bump structures 58. Herein, each redistribution interconnection 54 is connected to a corresponding connecting layer 50 within the BEOL portion 22 and extends over a bottom surface of the BEOL portion 22. The connections between the redistribution interconnections 54 and the connecting layers 50 are solder-free. The dielectric pattern 56 is formed around and underneath each redistribution interconnection 54. Some of the redistribution interconnections 54 (connect the mold device die 12 to other device components formed from the same wafer) may be encapsulated by the dielectric pattern 56 (not shown), while some of the redistribution interconnections 54 have a bottom portion exposed through the dielectric pattern 56. Each bump structure 58 is formed at a bottom surface of the multilayer redistribution structure 18 and electrically coupled to a corresponding redistribution interconnection 54 through the dielectric pattern 56. As such, the redistribution interconnections 54 are configured to connect the bump structures 58 to certain ones of the connecting layers 50 in the BEOL portion 22, which are electrically connected to the FEOL portion 20. Consequently, the bump structures 58 are electrically connected to the FEOL portion 20 via corresponding redistribution interconnections 54 and corresponding connecting layers 50. In addition, the bump structures 58 are separate from each other and protrude from the dielectric pattern 56.

In some applications, there may be extra redistribution interconnections (not shown) electrically coupled to the redistribution interconnections 54 through the dielectric pattern 56, and extra dielectric patterns (not shown) formed underneath the dielectric pattern 56, such that a bottom portion of some extra redistribution interconnections may be exposed. Consequently, each bump structure 58 is coupled to a corresponding extra redistribution interconnection through the extra dielectric pattern (not shown). Regardless of the level numbers of the redistribution interconnections and/or the dielectric pattern, the multilayer redistribution structure 18 may be free of glass fiber or glass-free. Herein, the glass fiber refers to individual glass strands twisted to become a larger grouping. These glass strands may then be woven into a fabric. The redistribution interconnections 54 may be formed of copper or other suitable metals. The dielectric pattern 56 may be formed of benzocyclobutene (BCB), polyimide, or other dielectric materials. The bump structures 58 may be solder balls or copper pillars. The multilayer redistribution structure 18 has a thickness between 2 μm and 300 μm.

Figure 2:
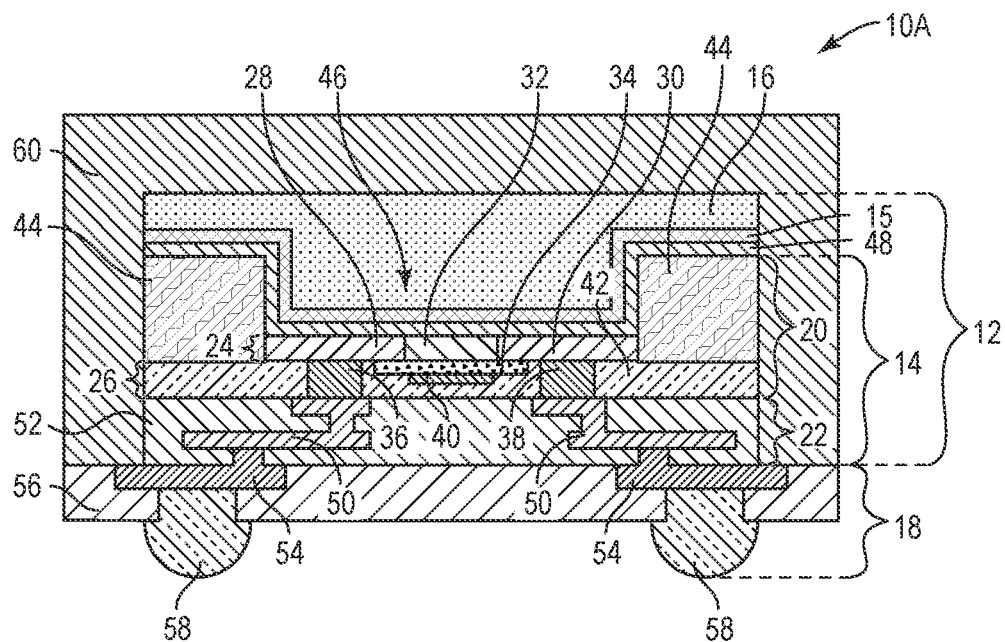
FIG. 2 shows an alternative RF device with enhanced thermal and electrical performance according to one embodiment of the present disclosure.

FIG. 2 shows an alternative RF device 10A, which further includes a second mold compound 60 compared to the RF device 10 shown in FIG. 1. Herein, the multilayer redistribution structure 18 may extend horizontally beyond the mold device die 12, and the second mold compound 60 resides over the multilayer redistribution structure 18 to encapsulate the mold device die 12. In this embodiment, the redistribution interconnections 54 of the multilayer redistribution structure 18 may extend horizontally beyond the mold device die 12, and the bump structures 58 of the multilayer redistribution structure 18 may not be confined within a periphery of the mold device die 12. The second mold compound 60 may be formed of a same or different material as the first mold compound 16. Unlike the first mold compound 16, the second mold compound 60 may not have thermal conductivity or dielectric constant requirements.

FIGS. 3-16 provide an exemplary wafer-level fabricating and packaging process that illustrates steps to fabricate the exemplary RF device 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3-16.

Figure 3:
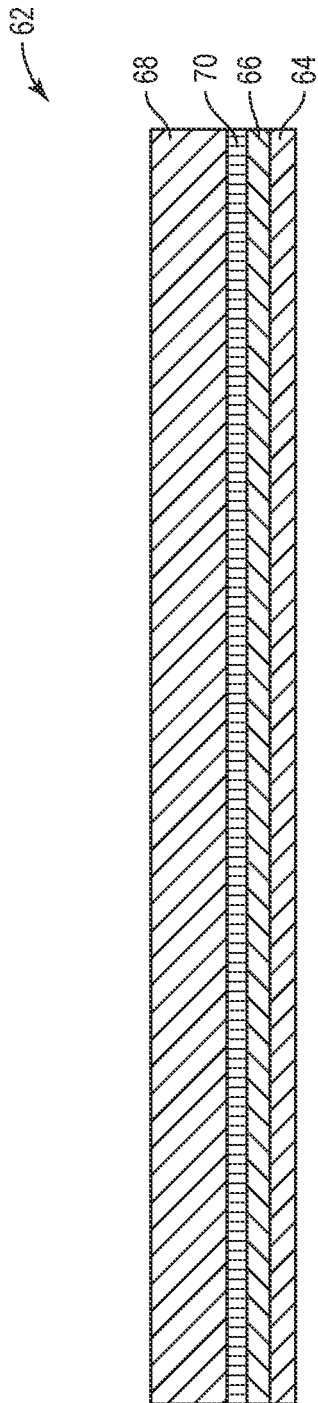

Initially, a starting wafer 62 is provided as illustrated in FIG. 3. The starting wafer 62 includes a common silicon epitaxial layer 64, a common interfacial layer 66 over the common silicon epitaxial layer 64, and a silicon handle substrate 68 over the common interfacial layer 66. Herein, the common silicon epitaxial layer 64 is formed from a device grade silicon material, which has desirable silicon epitaxy characteristics to form electronic devices. The silicon handle substrate 68 may consist of conventional low cost silicon. The common interfacial layer 66 is formed of SiGe with a uniform concentration of Ge or a graded concentration of Ge. In some applications, the Ge concentration, uniform throughout the common interfacial layer 66, may be greater than 15% or greater than 25%. In some applications, the Ge concentration may be vertically graded between 1% and 50% (ex. from the silicon handle substrate 68 to the common interfacial layer 66 with a lower concentration (0%) of Ge to a higher concentration (30%) of Ge) so as to yield the necessary strain relief for the growth of the common silicon epitaxial layer 64.

In one embodiment, a common p-type doped layer 70 may be formed between the silicon handle substrate 68 and the common interfacial layer 66. As such, the common interfacial layer 66 and the common p-type doped layer 70 separate the common silicon epitaxial layer 64 from the silicon handle substrate 68. The common p-type doped layer 70 may be a silicon layer heavily doped with a p-type material, such as boron. Herein, the term "heavily doped with a p-type material" refers to a doped concentration of a p-type material greater than 1E18 cm-3. For instance, the common p-type doped layer 70 may have a boron concentration of 1E19 cm-3 or higher. The common p-type doped layer 70 is engineered such that the p-type atoms in it do not diffuse through the common interfacial layer 66 and into the common silicon epitaxial layer 64 where the p-type atoms could lead to changes in the electrical properties of the device.

The common silicon epitaxial layer 64 and the common interfacial layer 66 may be grown by conventional epitaxy techniques, and the common p-type doped layer 70 may be grown by either epitaxial techniques or by ion-implantation. The common silicon epitaxial layer 64 may have a thickness between 700 nm and 2000 nm. The common interfacial layer 66 may have a thickness between 100 Å and 1000 Å. The silicon handle substrate 68 may have a thickness between 200 μm and 700 μm. The common p-type doped layer 70 may have a thickness between 100 Å and 5000 Å.

Figure 4A:
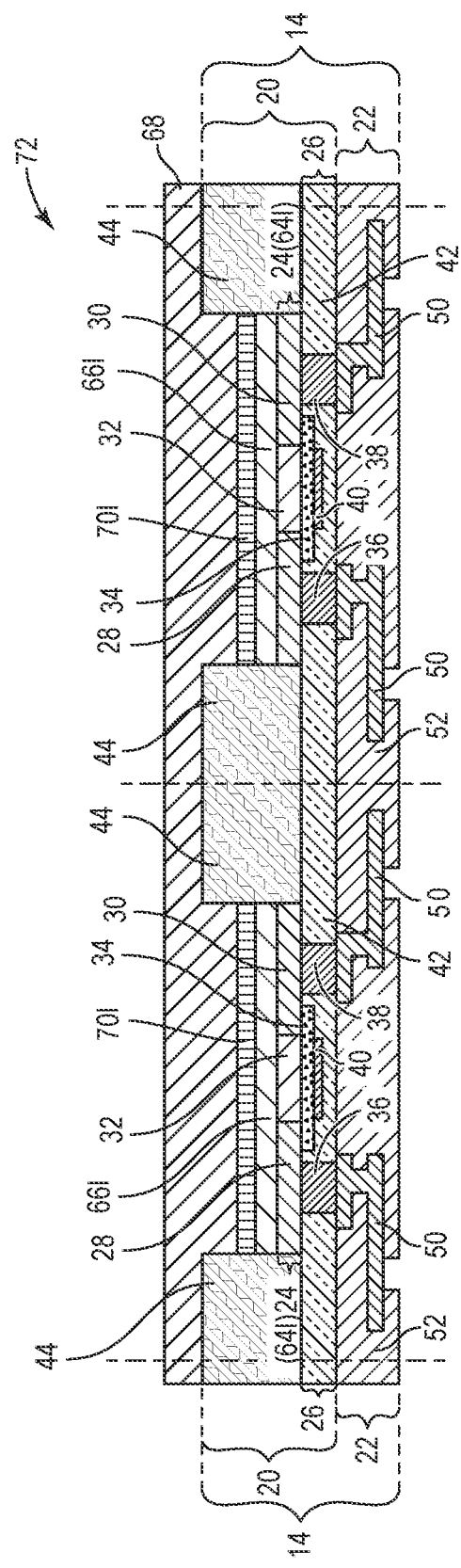

Next, a complementary metal-oxide-semiconductor (CMOS) process is performed on the starting wafer 62 to provide a precursor wafer 72 with a number of the device regions 14, as illustrated in FIG. 4A. For the purpose of this illustration, the FEOL portion 20 of each device region 14 is configured to provide a switch FET. In different applications, the FEOL portion 20 may have different FET configurations or provide different device components, such as a diode, a capacitor, a resistor, and/or an inductor.

In one embodiment, the isolation sections 44 of each device region 14 extend through the common silicon epitaxial layer 64, the common interfacial layer 66, and the common p-type doped layer 70, and extend into the silicon handle substrate 68. As such, the common p-type doped layer 70 is separated into a number of individual p-type doped layers 70*l*, the common interfacial layer 66 is separated into a number of individual interfacial layers 66*l*, and the common silicon epitaxial layer 64 is separated into a number of individual silicon epitaxial layers 64*l*. Each individual silicon epitaxial layer 64*l* is used to form a corresponding active layer 24 in one device region 14. The isolation sections 44 may be formed by shallow trench isolation (STI).

The top surface of the active layer 24 is in contact with a corresponding interfacial layer 66*l*, which is underneath a corresponding p-type doped layer 70*l*. The silicon handle substrate 68 resides over each individual p-type doped layer 70*l*, and portions of the silicon handle substrate 68 may reside over the isolation sections 44. The BEOL portion 22 of the device region 14, which includes at least the multiple connecting layers 50 and the dielectric layers 52, is formed under the contact layer 26 of the FEOL portion 20. Bottom portions of certain connecting layers 50 are exposed through the dielectric layers 52 at the bottom surface of the BEOL portion 22.

Figure 4B:
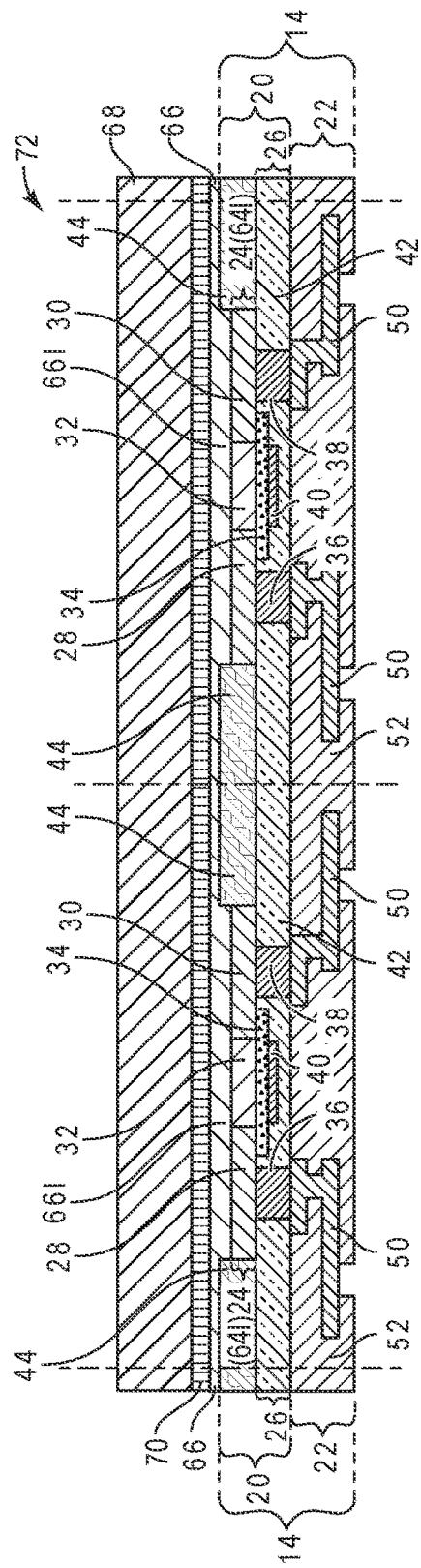

In another embodiment, the isolation sections 44 may not extend into the silicon handle substrate 68. Instead, the isolation sections 44 may only extend through the common silicon epitaxial layer 64 and extend into the common interfacial layer 66, as illustrated in FIG. 4B. Herein, the common interfacial layer 66 remains continuous, and resides over the top surface of each active layer 24 and a top surface of each isolation section 44. The common p-type doped layer 70 and the silicon handle substrate 68 remain intact. In addition, the isolation sections 44 may extend through the common silicon epitaxial layer 64 and the common interfacial layer 66, and extend into the common p-type doped layer 70 (not shown). The common p-type doped layer 70 remains continuous and resides over each individual interfacial layer 66*l* and each isolation section 44. The silicon handle substrate 68 remains over the common p-type doped layer 70. Further, the isolation sections 44 may extend through the common silicon epitaxial layer 64 but do not extend into the common interfacial layer 66 (not shown). The top surface of each isolation section 44 and the top surface of each active layer 24 may be coplanar (not shown). The common interfacial layer 66, the common p-type doped layer 70, and the silicon handle substrate 68 remain intact. The common interfacial layer 66 is over each isolation section 44 and each active layer 24, the common p-type doped layer 70 remains over the common interfacial layer 66, and the silicon handle substrate 68 remains over the common p-type doped layer 70.

Figure 5:
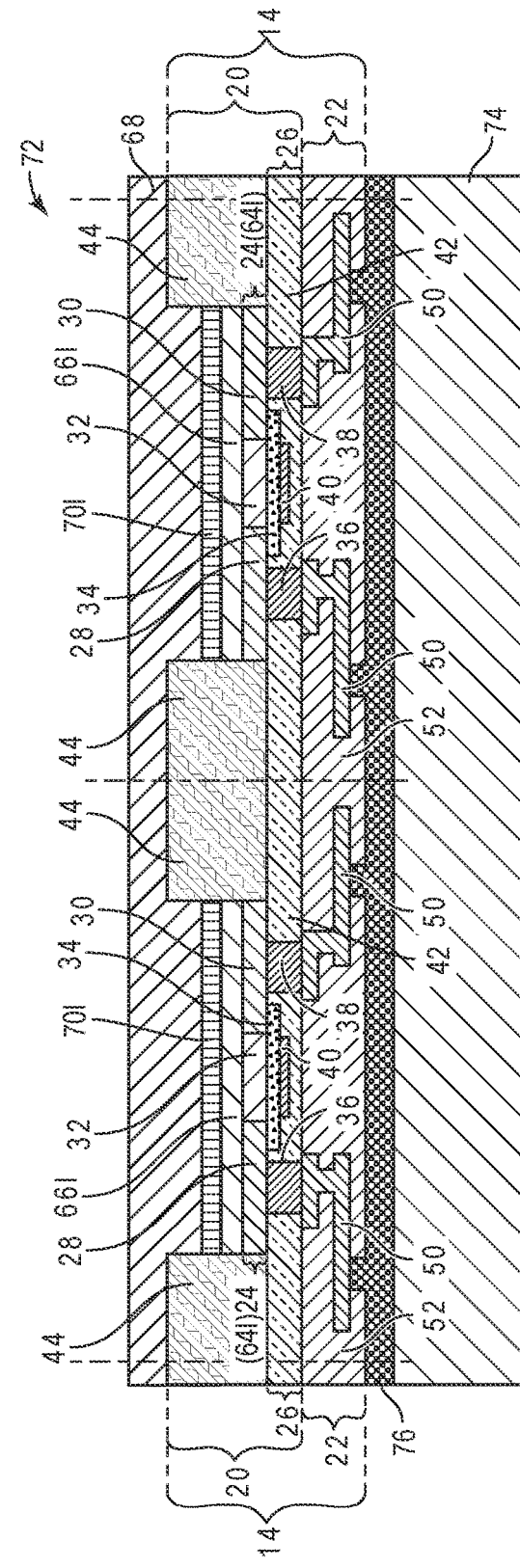

After the precursor wafer 72 is completed, the precursor wafer 72 is then bonded to a temporary carrier 74, as illustrated in FIG. 5. The precursor wafer 72 may be bonded to the temporary carrier 74 via a bonding layer 76, which provides a planarized surface to the temporary carrier 74. The temporary carrier 74 may be a thick silicon wafer from a cost and thermal expansion point of view, but may also be constructed of glass, sapphire, or any other suitable carrier material. The bonding layer 76 may be a span-on polymeric adhesive film, such as the Brewer Science WaferBOND line of temporary adhesive materials.

Figure 6:
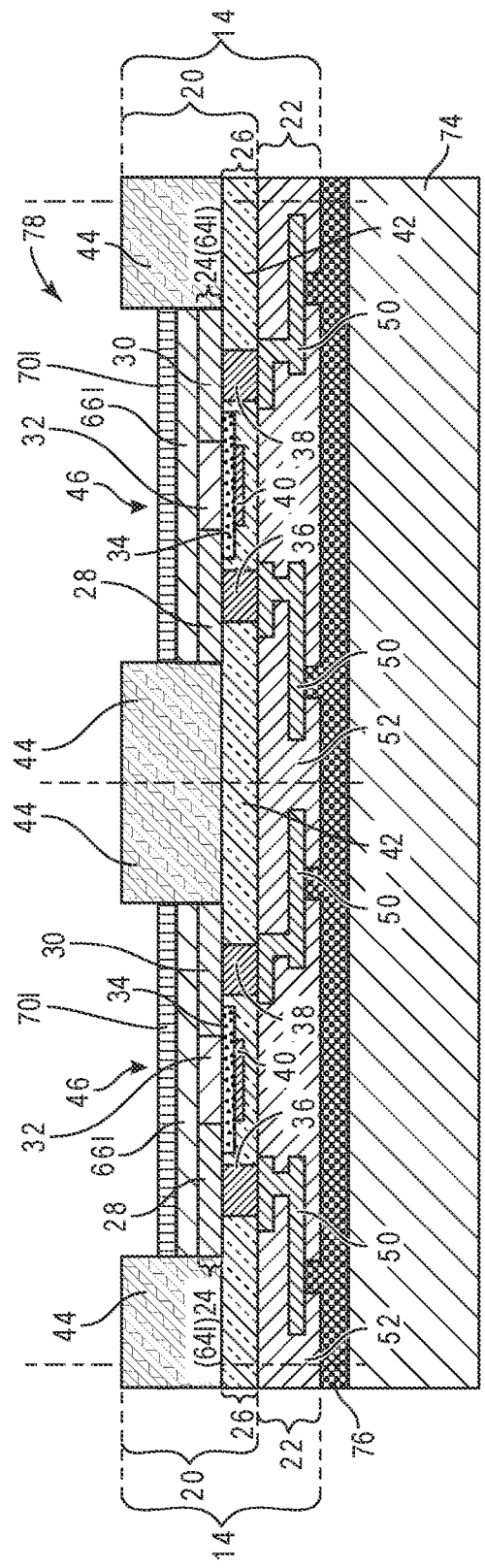

The silicon handle substrate 68 is then selectively removed to provide an etched wafer 78, as illustrated in FIG. 6. Although individual p-type doped layers 70*l* and the silicon handle substrate 68 include silicon, the individual p-type doped layers 70*l* and the silicon handle substrate 68 have significantly different doping concentrations of the p-type material. Therefore, each individual p-type doped layer 70*l* and the silicon handle substrate 68 have significantly different reactions to a same etching technique (for instance: compared to the silicon handle substrate 68, the individual p-type doped layer 70*l* reduces the etching speed 20-50 times with a same etchant). Consequently, the etching system may be capable of identifying the presence of each individual p-type doped layer 70*l*, and capable of indicating when to stop the etching process. As such, the selective removal stops at or into each individual p-type doped layer 70*l*. The individual p-type doped layers 70*l* ensure that the remaining layers in the etched wafer 78 are as uniform as possible, without having breached the individual interfacial layers 66*l* or without areas where the silicon handle substrate 68 remains.

In one embodiment, removing the silicon handle substrate 68 may be provided by a mechanical grinding process and an etching process, or provided by the etching system itself. As an example, the silicon handle substrate 68 may be ground to a thinner thickness to reduce the following etching time. An etching process is then performed to at least completely remove the remaining silicon handle substrate 68. The etching process may be provided by a wet etching system with an etchant chemistry, which is at least one of TMAH, KOH, NaOH, HNA etchant, HF/HNO3, and XeF2, or a dry etching system, such as a reactive ion etching system with a chlorine-based gas chemistry or a fluorine-based gas chemistry.

During the removal process, the isolation sections 44 are not removed and protect sides of each active layer 24. If the isolation sections 44 extend vertically beyond each individual p-type doped layer 70*l*, the removal of the silicon handle substrate 68 will provide the opening 46 over each individual p-type doped layer 70*l* and within the isolation sections 44. Herein, the top surface of each isolation section 44 and a top surface of each individual p-type doped layer 70*l* are exposed after the removal step of the silicon handle substrate 68. If the isolation sections 44 only extend into the common p-type doped layer 70, or only extend into the common interfacial layer 66, or the top surface of each isolation section 44 and the top surface of each active layer 24 are coplanar, only the top surface of the common p-type doped layer 70 may be exposed (not shown) after the removal of the silicon handle substrate 68. The bonding layer 76 and the temporary carrier 74 protect the bottom surface of each BEOL portion 22.

Figure 7:
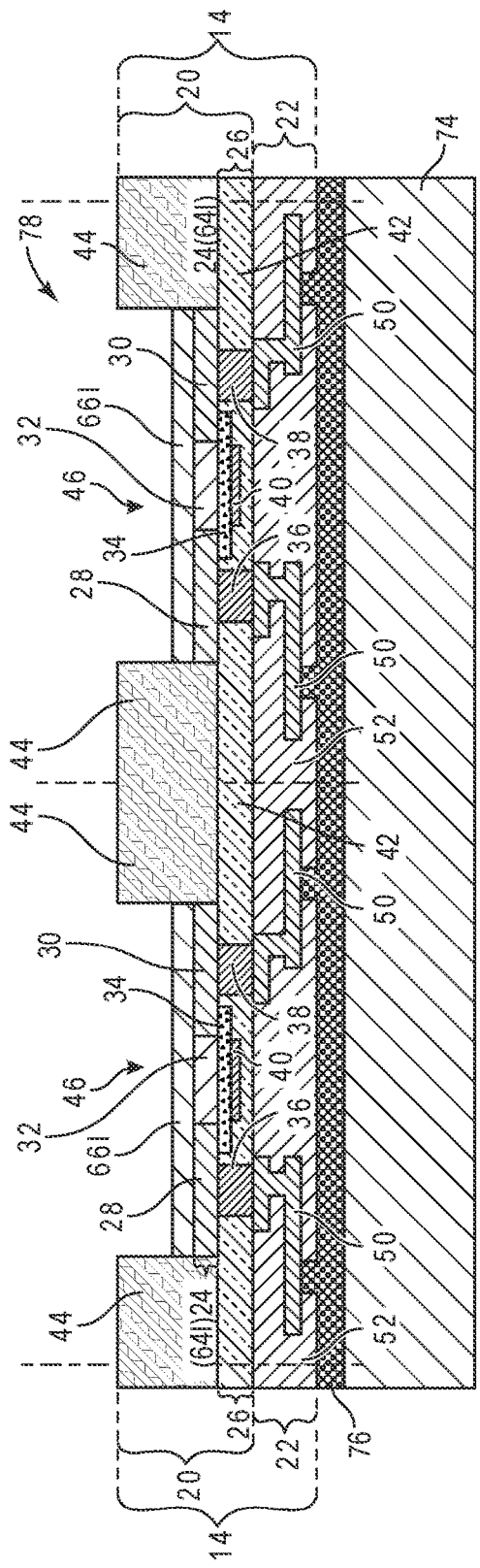

Since the individual p-type doped layers 70*l* are conductive, to avoid current leakage of the active layer 24, each individual p-type doped layer 70*l* is selectively removed from the etched wafer 78 after the removal of the silicon handle substrate 68, as illustrated in FIG. 7. The individual p-type doped layers 70*l* and the individual interfacial layers 66*l* have different germanium concentrations, therefore, they may have different reactions to a same etching technique (for instance: different etching speeds with a same etchant). Consequently, the etching system may be capable of identifying the presence of the individual interfacial layers 66*l* (presence of Ge), and capable of indicating when to stop the etching process. In one embodiment, a selective etching system for the individual p-type doped layers 70*l* and the individual interfacial layers 66*l* may be a high performance dry etch system capable of identifying the presence of the Ge atoms and then controlling the over-etch to ensure that the silicon handle substrate 68 is entirely removed.

Figure 8:
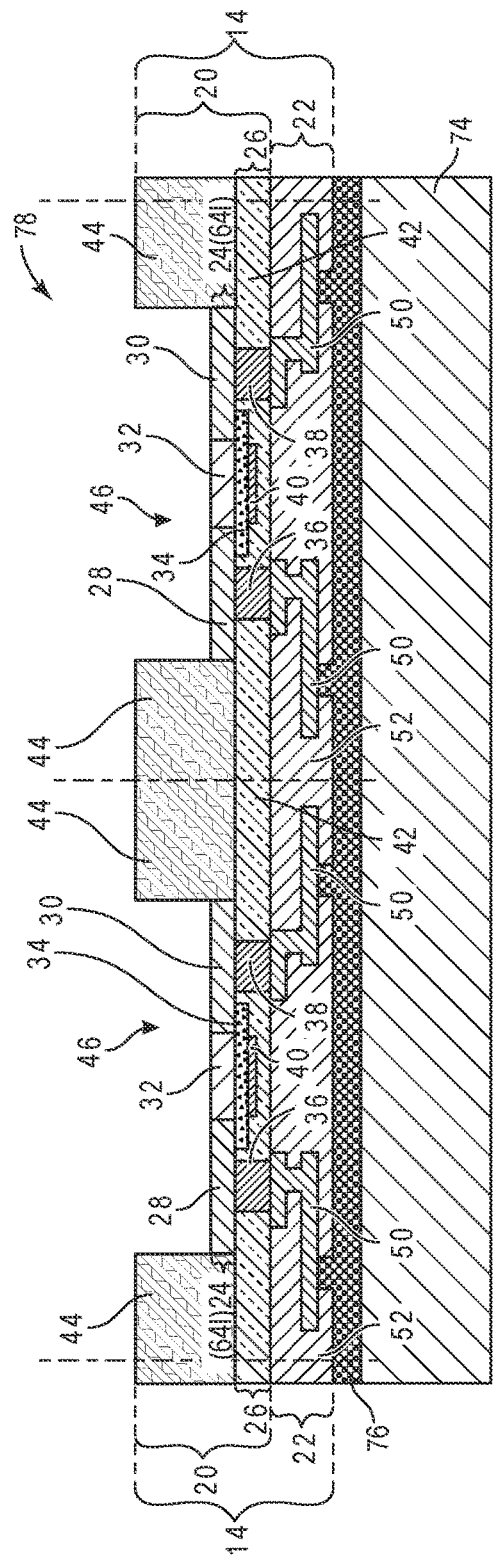

Due to the narrow gap nature of the SiGe material, it is possible that the individual interfacial layers 66*l* may be conductive (for some type of devices). The individual interfacial layers 66*l* may cause appreciable leakage between the source 28 and the drain 30 of the active layer 24. Therefore, in some applications, such as FET switch applications, it is desirable to also remove the individual interfacial layers 66*l*, as illustrated in FIG. 8. Each active layer 24 is exposed (at a bottom of a corresponding opening 46 if there is one opening 46 over each active layer 24). Herein, if each individual interfacial layer 66*l* is thin enough, it may not cause any appreciable leakage between the source 28 and the drain 30 of the active layer 24. In that case, the individual interfacial layers 66*l* may be left (not shown). The silicon handle substrate 68, the individual p-type doped layers 70*l*, and the individual interfacial layers 66*l* may be removed by different etching processes.

Figure 9:
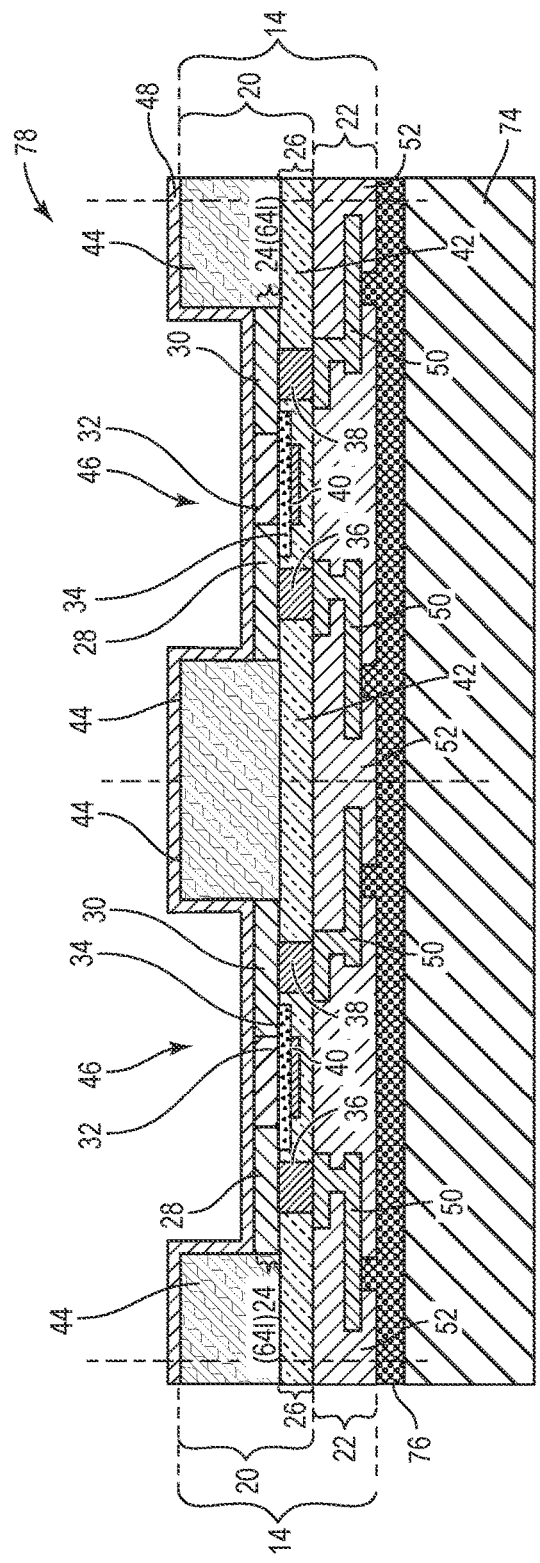

In some applications, after the removal of the silicon handle substrate 68, the individual p-type doped layers 70*l*, and the individual interfacial layers 66*l*, the active layer 24 may be passivated to achieve proper low levels of current leakage in the device. The passivation layer 48 may be formed directly over the FEOL portion 20 of each device region 14, as illustrated in FIG. 9. Herein, the passivation layer 48 may extend over an entire backside of the etched wafer 78, such that the passivation layer 48 continuously covers exposed surfaces within each opening 46 and top surfaces of the isolation sections 44. In some applications, the passivation layer 48 may only cover the top surface of each active layer 24 within the corresponding opening 46 (not shown). The passivation layer 48 may be formed of silicon dioxide by a plasma enhanced deposition process, an anodic oxidation process, an ozone-based oxidation process, and a number of other proper techniques.

Figure 10:
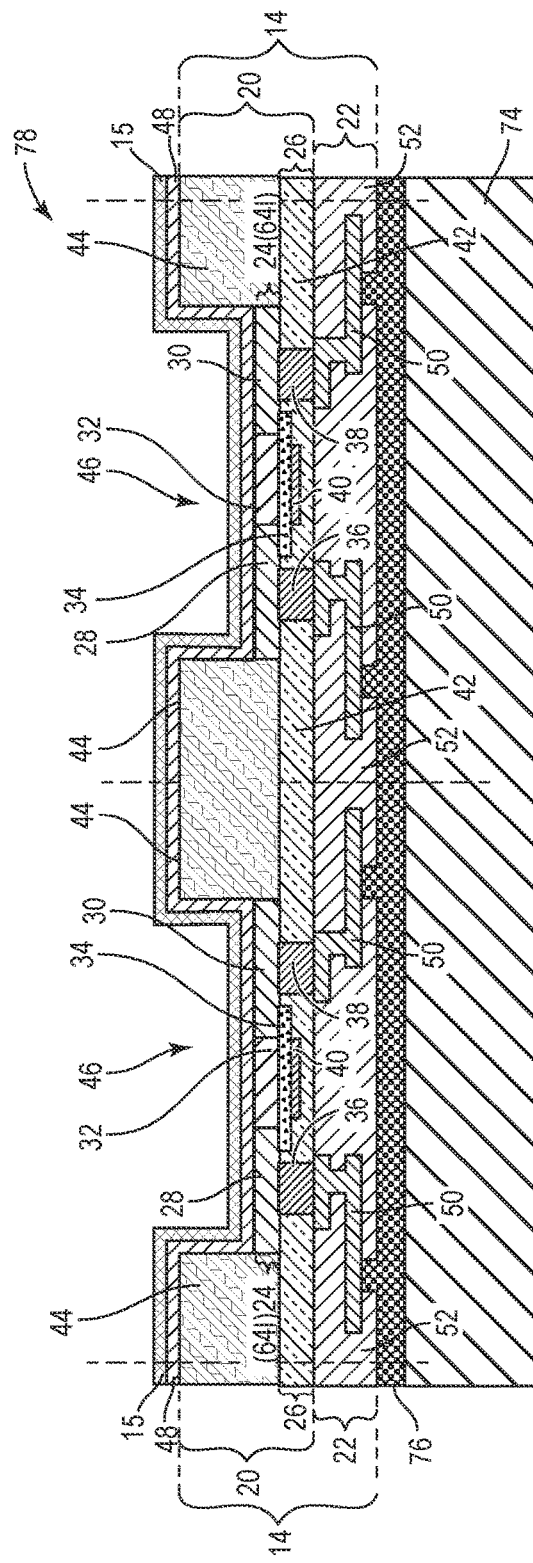

Next, the thermally conductive film 15 is applied over the passivation layer 48, as illustrated in FIG. 10. If the passivation layer 48 does not exist, the thermally conductive film 15 is formed directly over the FEOL portion 20 of each device region 14, such that the thermally conductive film 15 continuously covers exposed surfaces within each opening 46 and top surfaces of the isolation sections 44 (not shown). Notice that, regardless of the presence of the passivation layer 48, the individual interfacial layer 66*l*, or the individual p-type doped layer 70*l*, the thermally conductive film 15 always resides over the top surface of each active layer 24.

Herein, the thermally conductive film 15 has a high thermal conductivity between 10 W/m·K and 3000 W/m·K, and a high electrical resistivity between 1E5 Ohm-cm and 1E12 Ohm-cm. The thermally conductive film 15 may include nitrides and or ceramics, such as silicon nitride, aluminum nitride, alumina, boron nitride, diamond-based materials, and the like. In addition, the thermally conductive film 15 may be formed from carbon nanotube rich layers.

Heat generated in the device regions 14 may travel upward to an area above each active layer 24, pass laterally in the area above each active layer 24, and then pass downward through the device regions 14 (toward the multilayer redistribution structure 18 formed later). It is therefore highly desirable to have a high thermal conductivity region adjacent to each active layer 24 to conduct most of the heat generated by the device regions 14. Consequently, the higher the thermal conductivity in the adjacent region above each active layer 24, the better the heat dissipation performance of the device regions 14. Depending on different deposition stresses and different deposited materials, the thermally conductive film 15 may have different thicknesses varying from 100 Å to 50 µm. For a diamond-based material, which has an extremely high thermal conductivity between 1000 W/m·K and 3000 W/m·K, a very thin thickness of the thermally conductive film 15, such as between 100 Å and 1000 Å, will be extremely effective for the heat dissipation management of the device regions 14. In the case of aluminum nitride, the thermal conductivity is the order of 180 W/m·K and the thermally conductive film 15 may need to be relatively thick for thermal behavior enhancement, such as between 1 μm and 20 μm. In the case of silicon nitride, the thermal conductivity is between 10 W/m·K and 40 W/m·K, and the thermally conductive film 15 may have a thickness between 30 μm and 40 μm. The thermally conductive film 15 may be formed by a chemical vapor deposition process, such as plasma enhanced chemical vapor deposition (PECVD) or atomic layer deposition (ALD), such as a PEALD system.

Figure 11:
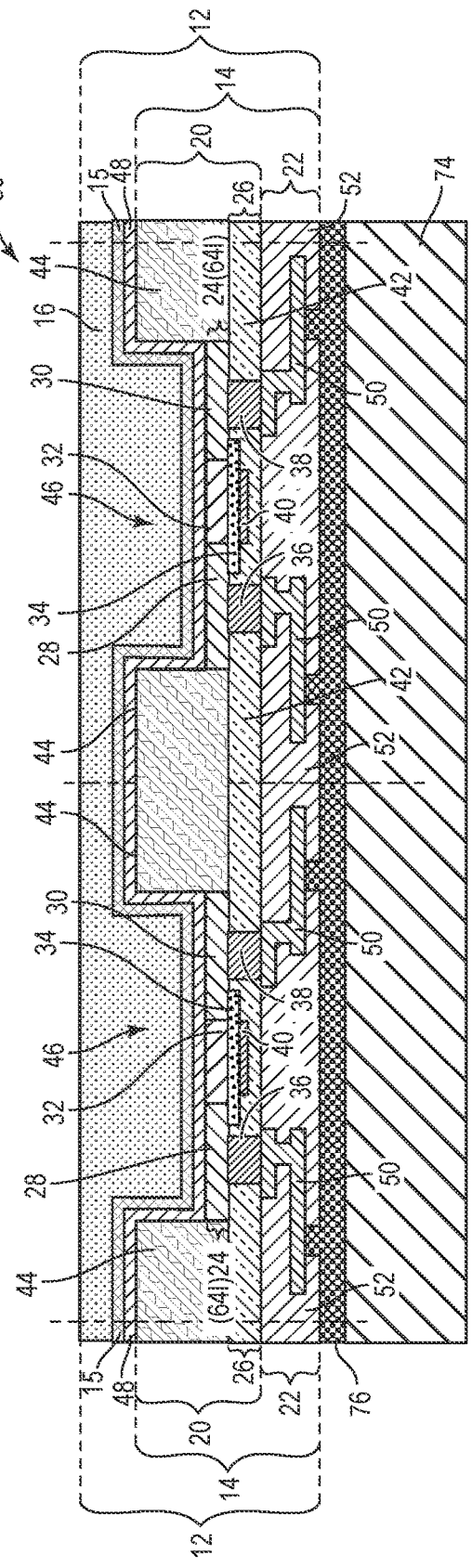

The first mold compound 16 is then applied over the thermally conductive film 15 to provide a mold device wafer 80, as illustrated in FIG. 11. The mold device wafer 80 includes a number of the mold device dies 12, each of which includes the device region 14, a portion of the thermally conductive film 15, and a portion of the first mold compound 16. Herein, the first mold compound 16 fills each opening 46 and fully covers the thermally conductive film 15. Notice that, regardless of the presence of the thermally conductive film 15, the passivation layer 48, or the individual interfacial layer 66l, silicon crystal, which has no germanium, nitrogen, or oxygen content, does not exist between the first mold compound 16 and the top surface of each active layer 24. The thermally conductive film 15, the passivation layer 48, and the individual interfacial layer 66l are silicon composite.

The first mold compound 16 may be applied by various procedures, such as compression molding, sheet molding, overmolding, transfer molding, dam fill encapsulation, and screen print encapsulation. Although the first mold compound 16 is not immediately above the active layer 24, the first mold compound 16 is still close to the active layer 24. Consequently, it is also desirable for the first mold compound 16 to have a relatively high thermal conductivity and a relatively high electrical resistivity. In one embodiment, the first mold compound 16 may have a lower thermal conductivity than the thermally conductive film 15. The first mold compound 16 has a thermal conductivity between 1 W/m·K and 100 W/m·K, or between 7 W/m·K and 20 W/m·K. In addition, the first mold compound 16 may have a low dielectric constant less than 8, or between 3 and 5 to yield low RF coupling.

During the molding process of the first mold compound 16, the temporary carrier 74 provides mechanical strength and rigidity to the etched wafer 78. A curing process (not shown) is then performed to harden the first mold compound 16. The curing temperature is between 100° C. and 320° C. depending on which material is used as the first mold compound 16. After the curing process, the first mold compound 16 may be thinned and/or planarized (not shown).

The temporary carrier 74 is then debonded from the mold device wafer 80, and the bonding layer 76 is cleaned from the mold device wafer 80, as illustrated in FIG. 12. A number of debonding processes and cleaning processes may be applied depending on the nature of the temporary carrier 74 and the bonding layer 76 chosen in the earlier steps. For instance, the temporary carrier 74 may be mechanically debonded using a lateral blade process with the stack heated to a proper temperature. Other suitable processes involve radiation of UV light through the temporary carrier 74 if it is formed of a transparent material, or chemical debonding using a proper solvent. The bonding layer 76 may be eliminated by wet or dry etching processes, such as proprietary solvents and plasma washing. After the debonding and cleaning process, the bottom portions of certain ones of the connecting layers 50, which may function as input/output (I/O) ports of the mold device die 12, are exposed through the dielectric layers 52 at the bottom surface of each BEOL portion 22. As such, each mold device die 12 in the mold device wafer 80 may be electrically verified to be working properly at this point.

With reference to FIGS. 13 through 15, the multilayer redistribution structure 18 is formed underneath the mold device wafer 80 according to one embodiment of the present disclosure. Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 13-15.

A number of the redistribution interconnections 54 are firstly formed underneath each BEOL portion 22, as illustrated in FIG. 13. Each redistribution interconnection 54 is electrically coupled to the exposed bottom portion of the corresponding connecting layer 50 within the BEOL portion 22, and may extend over the bottom surface of the BEOL portion 22. The connections between the redistribution interconnections 54 and the connecting layers 50 are solder-free. The dielectric pattern 56 is then formed underneath each BEOL portion 22 to partially encapsulate each redistribution interconnection 54, as illustrated in FIG. 14. As such, the bottom portion of each redistribution interconnection 54 is exposed through the dielectric pattern 56. In different applications, there may be extra redistribution interconnections (not shown) electrically coupled to the redistribution interconnection 54 through the dielectric pattern 56, and extra dielectric patterns (not shown) formed underneath the dielectric pattern 56, such that a bottom portion of each extra redistribution interconnection is exposed.

Next, a number of the bump structures 58 are formed to complete the multilayer redistribution structure 18 and provide a wafer-level fan-out (WLFO) package 82, as illustrated in FIG. 15. Each bump structure 58 is formed at the bottom of the multilayer redistribution structure 18 and electrically coupled to an exposed bottom portion of the corresponding redistribution interconnection 54 through the dielectric pattern 56. Consequently, the redistribution interconnections 54 are configured to connect the bump structures 58 to certain ones of the connecting layer 50 in the BEOL portion 22, which are electrically connected to the FEOL portion 20. As such, the bump structures 58 are electrically connected to the FEOL portion 20 via corresponding redistribution interconnections 54 and corresponding connecting layers 50. In addition, the bump structures 58 are separate from each other and protrude vertically from the dielectric pattern 56.

Figure 16:
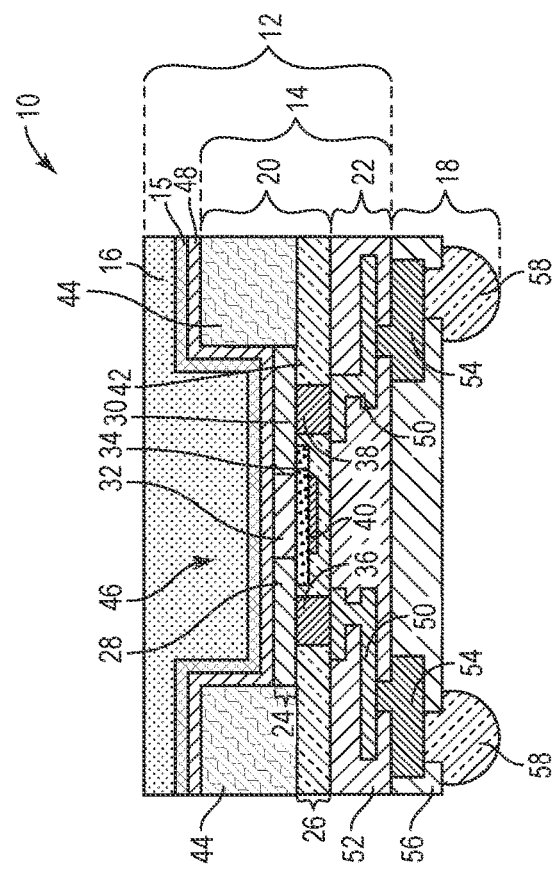

The multilayer redistribution structure 18 may be free of glass fiber or glass-free. Herein, the glass fiber refers to individual glass strands twisted to become a larger grouping. These glass strands may then be woven into a fabric. The redistribution interconnections 54 may be formed of copper or other suitable metals, the dielectric pattern 56 may be formed of BCB, polyimide, or other dielectric materials, and the bump structures 58 may be solder balls or copper pillars. The multilayer redistribution structure 18 has a thickness between 2 μm and 300 μm. FIG. 16 shows a final step to singulate the WLFO package 82 into individual RF devices 10. The singulating step may be provided by a probing and dicing process at certain isolation sections 44.

In another embodiment, FIGS. 17-22 provide an alternative process that illustrates steps to fabricate the alternative RF device 10A shown in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 17-22.

Figure 17:
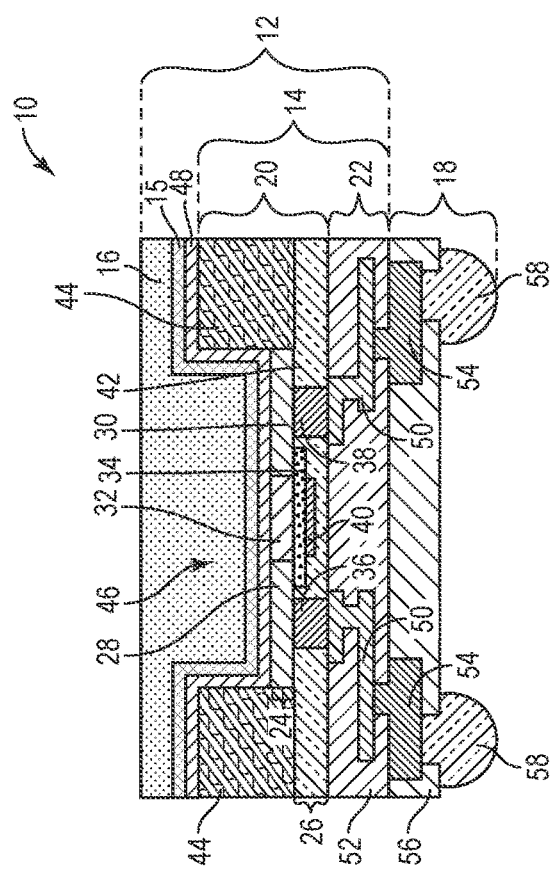

After the debonding and cleaning process to provide the clean mold device wafer 80 as shown in FIG. 12, a singulating step is performed to singulate the mold device wafer 80 into individual mold device dies 12, as illustrated in FIG. 17. This singulating step may be provided by a probing and dicing process at certain isolation sections 44. Herein, each mold device die 12 may have a same height and includes the device region 14 with the FEOL portion 20 and the BEOL portion 22, the thermally conductive film 15, and the first mold compound 16.

Figure 18:
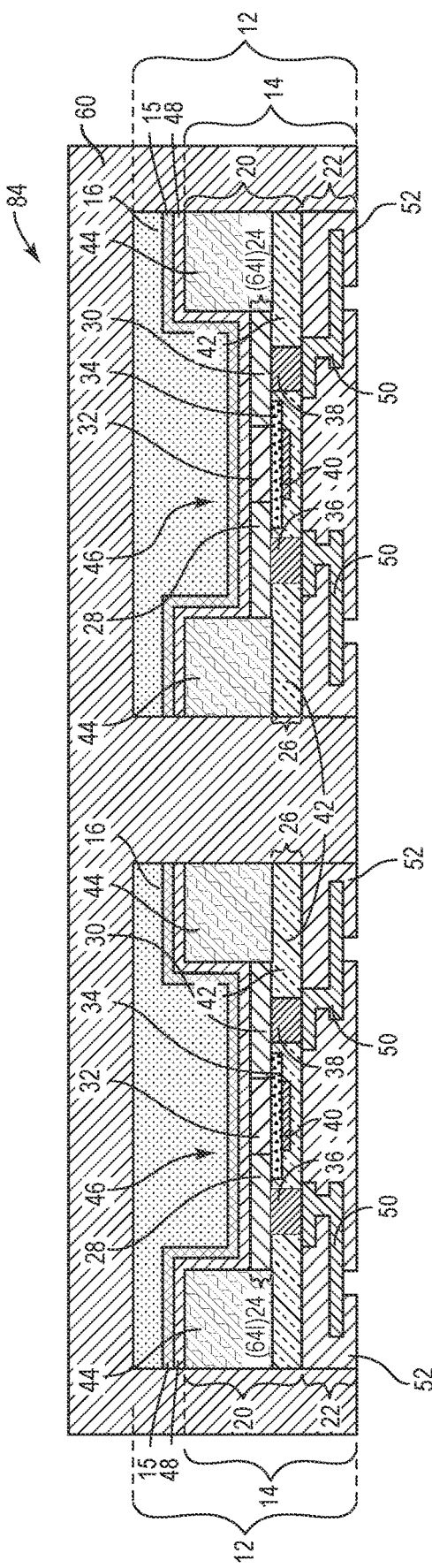

Next, the second mold compound 60 is applied around and over the mold device dies 12 to provide a double mold device wafer 84, as illustrated in FIG. 18. The second mold compound 60 encapsulates a top surface and side surfaces of each mold device die 12, while a bottom surface of each mold device die 12, which is the bottom surface of the BEOL portion 22, is exposed. A bottom surface of the double mold device wafer 84 is a combination of the bottom surface of each mold device die 12 and a bottom surface of the second mold compound 60. Herein, the bottom portions of certain ones of the connecting layers 50 remain exposed at the bottom surface of each mold device die 12. The second mold compound 60 may be applied by various procedures, such as sheet molding, overmolding, compression molding, transfer molding, dam fill encapsulation, or screen print encapsulation. The second mold compound 60 may be formed of the same or different material as the first mold compound 16. However, unlike the first mold compound 16, the second mold compound 60 does not have thermal conductivity or electrical resistivity requirements. The second mold compound 60 may be an organic epoxy resin system or the like. A curing process (not shown) is then used to harden the second mold compound 60. The curing temperature is between 100° C. and 320° C. depending on which material is used as the second mold compound 60. A grinding process (not shown) may be performed to provide a planarized top surface of the second mold compound 60.

Figure 19:
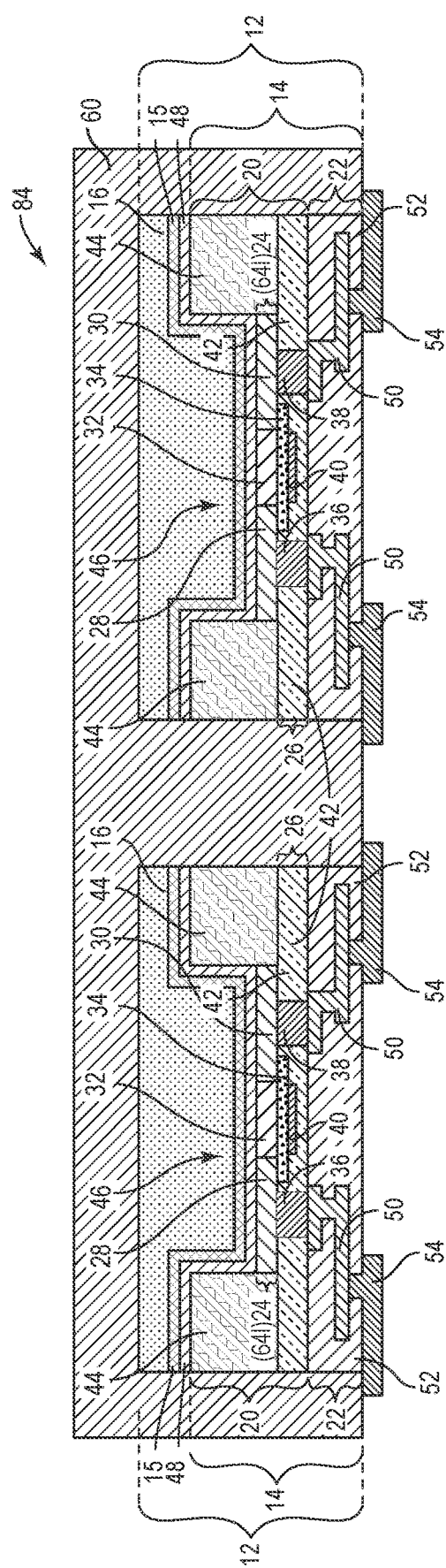

With reference to FIGS. 19 through 21, the multilayer redistribution structure 18 is formed according to one embodiment of the present disclosure. Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 19-21.

A number of the redistribution interconnections 54 are firstly formed underneath the double mold device wafer 84, as illustrated in FIG. 19. Each redistribution interconnection 54 is electrically coupled to the corresponding connecting layer 50 within the BEOL portion 22, and may extend horizontally beyond the corresponding mold device die 12 and underneath the second mold compound 60. The connections between the redistribution interconnections 54 and the connecting layers 50 are solder-free. The dielectric pattern 56 is then formed underneath the double mold device wafer 84 to partially encapsulate each redistribution interconnection 54, as illustrated in FIG. 20. As such, the bottom portion of each redistribution interconnection 54 is exposed through the dielectric pattern 56. In different applications, there may be extra redistribution interconnections (not shown) electrically coupled to the redistribution interconnection 54 through the dielectric pattern 56, and extra dielectric patterns (not shown) formed underneath the dielectric pattern 56, such that a bottom portion of each extra redistribution interconnection is exposed.

Next, a number of the bump structures 58 are formed to complete the multilayer redistribution structure 18 and provide an alternative WLFO package 82A, as illustrated in FIG. 21. Each bump structure 58 is formed at the bottom of the multilayer redistribution structure 18 and electrically coupled to an exposed bottom portion of the corresponding redistribution interconnection 54 through the dielectric pattern 56. Consequently, the redistribution interconnections 54 are configured to connect the bump structures 58 to certain ones of the connecting layers 50 in the BEOL portion 22, which are electrically connected to the FEOL portion 20. As such, the bump structures 58 are electrically connected to the FEOL portion 20 via corresponding redistribution interconnections 54 and corresponding connecting layers 50. Herein, the bump structures 58 may not be confined within a periphery of a corresponding mold device die 12. In addition, the bump structures 58 are separate from each other and protrude vertically from the dielectric pattern 56.

FIG. 22 shows a final step to singulate the alternative WLFO package 82A into individual alternative RF devices 10A. The singulating step may be provided by a probing and dicing process at portions of the second mold compound 60, which are horizontally between adjacent mold device dies 12.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing a precursor wafer comprising a plurality of device regions, a plurality of individual interfacial layers, a plurality of individual p-type doped layers, and a silicon handle substrate wherein:
   each of the plurality of device regions includes a back-end-of-line (BEOL) portion and a front-end-of-line (FEOL) portion over the BEOL portion, wherein the FEOL portion comprises isolation sections and an active layer, which is surrounded by the isolation sections and does not extend vertically beyond the isolation sections;
   each of the plurality of individual interfacial layers is over one active layer of a corresponding device region, wherein each of the plurality of individual interfacial layers is formed of silicon germanium (SiGe);
   each of the plurality of individual p-type doped layers is over a corresponding individual interfacial layer, wherein each of the plurality of individual p-type doped layers is a silicon layer doped with a p-type material that has a doped concentration greater than 1E18 cm-3; and
   the silicon handle substrate is over each of the plurality of individual p-type doped layers;
   completely removing the silicon handle substrate to provide an etched wafer; and
   completely removing each of the plurality of individual p-type doped layers from the etched wafer.

2. The method of claim 1 further comprising removing each of the plurality of individual interfacial layers from the etched wafer after removing each of the plurality of individual p-type doped layers.

3. The method of claim 1 wherein the p-type material is boron, which has a concentration of 1E19 cm-3 or higher within each of the plurality of individual p-type doped layers.

4. The method of claim 1 wherein:
each of the plurality of individual interfacial layers has a thickness between 100 Å and 1000 Å;
each of the plurality of individual p-type doped layers has a thickness between 100 Å and 5000 Å; and
the silicon handle substrate has a thickness between 200 µm and 700 µm.

5. The method of claim 1 further comprising applying a passivation layer over an entire backside of the etched wafer after removing each of the plurality of individual p-type doped layers, wherein:
the passivation layer covers the top surface of each active layer and the top surface of each isolation section; and
the passivation layer is formed of silicon dioxide with a thickness between 10 Å and 1000 Å.

6. The method of claim 5 further comprising removing each of the plurality of individual interfacial layers from the etched wafer after removing each of the plurality of individual p-type doped layers and before applying the passivation layer, wherein the active layer of each of the plurality of device regions is in contact with the passivation layer.

7. The method of claim 5 further comprising applying a thermally conductive film over the passivation layer, wherein the thermally conductive film has a thermal conductivity greater than 10 w/m·k and an electrical resistivity greater than 1E5 Ohm-cm.

8. The method of claim 7 wherein:
the thermally conductive film is formed of one of a group consisting of silicon nitride, aluminum nitride, alumina, boron-nitride, and a diamond-based material; and
the thermally conductive film has a thickness between 100 Å to 50 µm.

9. The method of claim 7 wherein the thermally conductive film is formed from carbon nanotube rich layers.

10. The method of claim 7 further comprising applying a first mold compound over the thermally conductive film to provide a mold device wafer that includes a plurality of mold device dies; wherein:
silicon crystal, which has no germanium, nitrogen, or oxygen content, does not exist between the active layer of each of the plurality of device regions and the first mold compound; and
each of the plurality of mold device dies includes a corresponding device region, a portion of the passivation layer over the corresponding device region, a portion of the thermally conductive film over the portion of the passivation layer, and a portion of the first mold compound over the portion of the thermally conductive film.

11. The method of claim 10 further comprising:
bonding the precursor wafer to a temporary carrier via a bonding layer before the silicon handle substrate is removed; and
debonding the temporary carrier and cleaning the bonding layer from the mold device wafer after the first mold compound is applied.

12. The method of claim 10 further comprising forming a multilayer redistribution structure underneath the mold device wafer, wherein:

the multilayer redistribution structure comprises a plurality of bump structures on a bottom surface of the multilayer redistribution structure and redistribution interconnections within the multilayer redistribution structure; and
each of the plurality of bump structures is electrically coupled to one active layer of a corresponding mold device die via the redistribution interconnections and connecting layers within the BEOL portion of the corresponding mold device die.

13. The method of claim 10 further comprising:
singulating the mold device wafer into a plurality of individual mold device dies;
applying a second mold compound around and over each of the plurality of individual mold device dies to provide a double mold device wafer, wherein:
the second mold compound encapsulates a top surface and side surfaces of each of the plurality of individual mold device dies, while a bottom surface of each of the plurality of individual mold device dies is exposed; and
a bottom surface of the double mold device wafer is a combination of the bottom surface of each of the plurality of individual mold device dies and a bottom surface of the second mold compound; and
forming a multilayer redistribution structure underneath the double mold device wafer, wherein:
the multilayer redistribution structure comprises a plurality of bump structures on a bottom surface of the multilayer redistribution structure and redistribution interconnections within the multilayer redistribution structure; and
each of the plurality of bump structures is electrically coupled to one active layer of a corresponding individual mold device die via the redistribution interconnections within the multilayer redistribution structure and connecting layers within the BEOL portion of the corresponding individual mold device die.

14. The method of claim 13 wherein the first mold compound and the second mold compound are formed of different materials.

15. The method of claim 1 wherein providing the precursor wafer comprises:
providing a starting wafer that includes a common silicon epitaxial layer, a common interfacial layer over the common silicon epitaxial layer, a common p-type doped layer over the common interfacial layer, and the silicon handle substrate over the common p-type doped layer, wherein the common interfacial layer is formed of SiGe, and the common p-type doped layer is a silicon layer doped with the p-type material that has a doped concentration greater than 1E18 cm-3; and
performing a complementary metal-oxide-semiconductor (CMOS) process to provide the precursor wafer, wherein:
the isolation sections extend through the common silicon epitaxial layer, the common interfacial layer, the common p-type doped layer, and extend into the silicon handle substrate, such that the common p-type doped layer is separated into the plurality of individual p-type doped layers, the common interfacial layer is separated into the plurality of individual interfacial layers, and the common silicon epitaxial layer is separated into a plurality of individual silicon epitaxial layers;

each active layer of the plurality of device regions is formed from a corresponding individual silicon epitaxial layer; and each of the plurality of individual interfacial layers resides over a top surface of a corresponding active layer, each of the plurality of individual p-type doped layers resides over the corresponding individual interfacial layer, and the silicon handle substrate resides over each of the plurality of individual p-type doped layers.

16. The method of claim 1 wherein the silicon handle substrate and the plurality of individual p-type doped layers are removed by different etching processes.

17. The method of claim 1 wherein the silicon handle substrate is removed by a mechanical grinding process followed by an etching process, wherein the etching process is provided by a wet etching system with an etchant chemistry, which is at least one of a group consisting of tetramethylammonium hydroxide (TMAH), potassium hydroxide (KOH), sodium hydroxide (NaOH), hydrofluoric-nitric-acetic (HNA) etchant, hydrofluoric-nitric acid (HF/HNO3), and xenon difluoride (XeF2).

18. The method of claim 1 wherein the silicon handle substrate is removed by a mechanical grinding process followed by an etching process, wherein the etching process is provided by a reactive ion etching system with a chlorine-based gas chemistry or a fluorine-based gas chemistry.

19. The method of claim 1 wherein each of the plurality of individual p-type doped layers is removed by a dry etch system capable of identifying the presence of the germanium atoms.

20. An apparatus comprising:
a mold device die comprising a device region, a passivation layer, a thermally conductive film, and a first mold compound, wherein:
the device region includes a front-end-of-line (FEOL) portion and a back-end-of-line (BEOL) portion underneath the FEOL portion, wherein the FEOL portion comprises an active layer and isolation sections, which surround the active layer and extend vertically beyond a top surface of the active layer to define an opening within the isolation sections and over the active layer;
the passivation layer extends over an entire backside of the device region, such that the passivation layer continuously resides over exposed surfaces within the opening and top surfaces of the isolation sections;
the thermally conductive film resides over the passivation layer, wherein the thermally conductive film has a thermal conductivity greater than 10 w/m·k and an electrical resistivity greater than 1E5 Ohm-cm; and
the first mold compound resides over the thermally conductive film, wherein a silicon crystal, which has no germanium, nitrogen, or oxygen content, does not exist between the first mold compound and the active layer; and
a multilayer redistribution structure formed underneath the BEOL portion of the mold device die, wherein the multilayer redistribution structure comprises a plurality of bump structures, which are on a bottom surface of the multilayer redistribution structure and electrically coupled to the FEOL portion of the mold device die.

21. An apparatus comprising:
a mold device die comprising a device region, a passivation layer, a thermally conductive film, and a first mold compound, wherein:
the device region includes a front-end-of-line (FEOL) portion and a back-end-of-line (BEOL) portion underneath the FEOL portion, wherein the FEOL portion comprises an active layer and isolation sections, which surround the active layer and extend vertically beyond a top surface of the active layer to define an opening within the isolation sections and over the active layer;
the passivation layer extends over an entire backside of the device region, such that the passivation layer continuously resides over exposed surfaces within the opening and top surfaces of the isolation sections;
the thermally conductive film resides over the passivation layer, wherein the thermally conductive film has a thermal conductivity greater than 10 W/m·K and an electrical resistivity greater than 1E5 Ohm-cm; and
the first mold compound resides over the thermally conductive film, wherein a silicon crystal, which has no germanium, nitrogen, or oxygen content, does not exist between the first mold compound and the active layer;
a multilayer redistribution structure formed underneath the BEOL portion of the mold device die, wherein:
the multilayer redistribution structure extends horizontally beyond the mold device die; and
the multilayer redistribution structure comprises a plurality of bump structures, which are on a bottom surface of the multilayer redistribution structure, and electrically coupled to the FEOL portion of the mold device die; and
a second mold compound residing over the multilayer redistribution structure to encapsulate the mold device die.

* * * * *